(12) United States Patent
Saito et al.

(10) Patent No.: US 6,373,745 B2
(45) Date of Patent: Apr. 16, 2002

(54) SEMICONDUCTOR MEMORY CELL AND SEMICONDUCTOR MEMORY DEVICE

(75) Inventors: Yoritaka Saito, Tsukuba; Hiroshi Ikeda, Edosaki-machi; Takumi Nasu, Tsuchiura; Kohsuke Ikeda, Ryugasaki; Yoshinobu Matsumoto, Ushiku; Satoshi Nakayama, Ami-machi; Yasuhito Ichimura, Kasama, all of (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/813,530

(22) Filed: Mar. 21, 2001

(30) Foreign Application Priority Data

Mar. 21, 2000 (JP) .......................................... 12-078858

(51) Int. Cl.$^7$ ............................................. G11C 11/34
(52) U.S. Cl. .................. 365/174; 365/177; 365/189.01; 365/189.09
(58) Field of Search ................................ 365/174, 177, 365/189.01, 189.09, 104, 154

(56) References Cited

U.S. PATENT DOCUMENTS 5,550,771 A * 8/1996 Hatori ........................ 365/174

* cited by examiner

*Primary Examiner*—David Nelms
*Assistant Examiner*—David Lam
(74) *Attorney, Agent, or Firm*—William B. Kempler; Frederick J. Telecky, Jr.

(57) ABSTRACT

The objective of this invention is to reduce the layout area while guaranteeing data retention stability in a static type semiconductor memory cell. This SRAM cell is constituted with two MOS transistors 10 and 12 and one inverter circuit 14. The source terminal of PMOS transistor 10 is connected to bit line (BL), the drain terminal is connected to data storage node (Na), and the gate terminal is connected to word line (WL). The source tenninal of NMOS transistor 12 is connected to a supply voltage terminal that provides low-level reference potential $V_{SS}$ (for example, zero volts), the drain terminal is connected to data storage node (Na), and the gate terminal is connected to the output terminal o inverter circuit 14. The input terminal of inverter circuit 14 is connected to data storage node (Na).

17 Claims, 13 Drawing Sheets

SEMICONDUCTOR MEMORY CELL AND SEMICONDUCTOR MEMORY DEVICE

FIELD OF THE INVENTION

The present invention pertains to a semiconductor memory, and in particular to a SRAM (static random access memory).

BACKGROUND OF THE INVENTION

As shown in FIG. 30, a general memory cell in an existing SRAM is constituted with six MOS (metal oxide semiconductor) transistors 300–310. In this memory cell, PMOS (p-channel MOS) transistor 300 and NMOS (n-channel MOS) 302, and PMOS transistor 304 and NMOS transistor 306 constitute CMOS (complementary MOS) inverters 312 and 314, respectively. These CMOS inverters 312 and 314 are cross-coupled and cross-connected to constitute a latch circuit or flip-flop. Both of the NMOS transistors 308 and 310 constitute a transfer gate for electrically closing or opening (breaking) the circuit between data storage nodes (N1) and (N2), that are Finished with a pair of complementary cross-coupled nodes in this flip-flop, and bit line pair (BL) and (BL-).

When data are written to this memory cell, both transfer gates 308 and 310 turn on due to word line (WL) being activated to the high level. A pair of voltage signals that have complementary logic levels that are already supplied onto bit line pair (BL) and (BL-) are input (written) to their respective data storage nodes (N1) and (N2).

During standby mode when data are held, both transfer gates 308 and 310 will be off, and the logic level of data storage nodes (N1) and (N2) is held by the data latch function of the flip-flop.

When data are read from this memory cell, after bit line pair (BL) and (BL-) are brought to a high-impedance state, both of the transfer gates 308 and 310 will be on by word line (WL) being activated to the high level. A pair of voltage signals that have complementary logic levels is output onto bit line pair (BL) and (BL-) from data storage nodes (N1) and (N2), the potential difference between this bit line pair (BL) and (BL-) is detected and amnplified by a sense amplifier (not shown) and 1 bit of data is read.

With six-transistor SRAM cells such as the one described above, the data hold part is constituted with a flip-flop and leakage current that flows to one transistor that is off in each CMOS inverter 312 and 314 is quickly absorbed or replenished by the other transistor that is on. Thus, the potential of data storage nodes (N1) and (N2) is held stably in a static state and high-speed write/read operations are possible without requiring a refresh operation. However, there is the disadvantage that the circuit requires six transistors, making the memory cell array large. Compared to a DRAM (dynamic RAM) that is constituted with one transistor and one capacitor, general-purpose six-transistor SRAM cells require an appreciably larger layout area about 8 times with the same process).

The present invention was conceived in light of these problems of the prior art. Its objective is to provide a static type semiconductor memory cell and semiconductor memory device with which a reduced layout area will be realized while ensuring that data are held reliably.

Another objective of the present invention is to provide a static type semiconductor memory cell and semiconductor memory with which a reduced layout area will be realized while ensuring that that data are written and read reliably and at high speed.

SUMMARY OF THE INVENTION

In order to realize the aforementioned objectives, the semiconductor memory cell of the present invention is constituted with a data storage node that electrically stores 1 bit of data in the form of a voltage logic level; a first transistor connected between the bit line and the aforementioned data storage node and the control terminal of which is connected to the word line; a second transistor connected between the aforementioned data storage node and a first reference voltage terminal that provides a first reference potential that has a prescribed logic level; and an inverter circuit, the input terminal of which is connected to the aforementioned data storage node and the output terminal of which is connected to the control terminal of the aforementioned second transistor, which outputs a voltage to the aforementioned output terminal at a logic level opposite that of the voltage input to the aforementioned input terminal.

Also, the semiconductor memory device of the present invention is constituted with the aforementioned semiconductor memory cell; a data write means for writing the desired data to the data storage node of the aforementioned semiconductor memory cell, which drives the aforementioned bit line to a potential at a logic level that corresponds to the value of the aforementioned data and also drives the aforementioned word line to a prescribed potential to turn on the aforementioned first transistor; and a data read means for reading data stored in the data storage node of the aforementioned semiconductor memory cell, which drives the aforementioned word line to a prescribed potential to turn the aforementioned first transistor on after the aforementioned bit line is precharged to a potential at a logic level opposite that of the aforementioned first reference potential, and that thereby outputs the aforementioned stored data on the basis of the temporal change of the potential of the aforementioned bit line.

With the semiconductor memory cell of the present invention, the first transistor functions as a transfer gate and there is electrical conduction or non conduction between the bit line and the data storage node according to the word line potential. The second transistor constitutes a latch circuit that works in conjunction with the inverter circuit and it will be on or off directly according to the logical value of the output of the inverter circuit and indirectly according to the logic value of the potential that is written to or held by the data storage node.

In the semiconductor memory device of the present invention, in order to perform the data write operation at high speed, the aforementioned data write means should preferably be constituted to include a reference voltage control means that makes the potential of the aforementioned first reference voltage terminal higher or lower by a prescribed amount relative to the standard reference potential in order to reduce the current flow through the aforementioned second transistor when the aforementioned date write means writes data at a logic level opposite that of the aforementioned first reference potential to the aforementioned data storage node. Or, the aforementioned data write means should also be constituted to include an inversion acceleration means that speeds up the inversion of the logic level of the output of the aforementioned inverter circuit in order to decrease the switching time of the aforementioned second transistor from on to off when the aforementioned data write means writes data at a logic value opposite that of the aforementioned first reference potential to the aforementioned data storage node.

Also, in order to perform data read operation at high speed, in the semiconductor memory device of the present invention, the aforementioned data read means should preferably be constituted to include a reference voltage control means that raises or lowers the potential of the aforementioned first reference voltage terminal by a prescribed amount in order to reduce current that flow through the aforementioned second transistor when data stored in the data storage node of the aforementioned semiconductor memory cell are read.

In the semiconductor memory cell of the present invention, when the second transistor turns on, the logic value of the potential of the data storage node is the same as the logic value of the aforementioned first reference voltage terminal and is held in a static state.

Also, when the second transistor turns off, the potential of the data storage node has a logical value that is the opposite of that of the aforementioned first reference potential and it is held in a floating state. In this case, leakage current in the second transistor, which is off, will operate to change the potential of the data storage node toward the potential of the first reference voltage terminal, that is, the logic level opposite that of the logic level currently held. However, in the first transistor, leakage current flows that will absorb or cancel the leakage current of the second transistor, so that the logic level (stored data) of the data storage node potential can be held reliably.

The semiconductor memory device of the present invention, in order to increase the reliability at which data are held during the standby period, should preferably be constituted with a data hold current control means that supplies current for holding data stored in the aforementioned data storage node via the aforementioned first transistor and control the aforementioned data hold current at the potential of the aforementioned word line.

In one form of the present invention, the data hold current control means comprises a monitoring node; a third transistor connected between a second supply voltage terminal that provides a prescribed reference potential at a logic level opposite that of the aforementioned reference potential and the aforementioned monitoring node; a fourth transistor connected between the aforementioned monitoring node and a third supply voltage terminal that provides a prescribed reference potential at the same logic level as the aforementioned first reference potential; an inverter circuit, the input terminal of which is connected to the aforementioned monitoring node, the output terminal of which is connected to the aforementioned fourth transistor control terminal, and that outputs voltage to the aforementioned output terminal at a logic level opposite that of the voltage input to the aforementioned input terminal; an initialization means that initializes the aforementioned monitoring node to a potential that has a logic level for keeping the aforementioned fourth transistor turned on; a monitor control means that controls the potential of the control terminal of the aforementioned third transistor so that the current that flows through the aforementioned third transistor will gradually increase with time after the aforementioned initialization; a word line potential control means that controls the potential of the aforementioned word line so that the current that flow through the aforementioned first transistor will gradually increase with time after the aforementioned initialization; and a reset means that stops the control operation of the aforementioned word line potential control means and returns the potential of the aforementioned word line to a prescribed reference level when the potential of the aforementioned monitoring node reaches a logic level opposite that of the logic level at the time of the aforementioned initialization. In this constitution, a resistor should preferably be connected in series with the aforementioned fourth transistor between the aforementioned monitoring node and the aforementioned third supply voltage terminal. The aforementioned third and fourth transistors could also have the essentially same transistor structure as the aforementioned first and second transistors, respectively, and they could be produced with the same process on the same semiconductor chip.

And in another form of the present invention, the aforementioned data hold current control means has a word line potential switching means that repeatedly switches at a fixed cycle between a first time when the aforementioned word line is brought to an active first potential and a second time when it is brought to an inactive second potential.

In this case, the aforementioned data hold current control means should also preferably comprise a monitoring node; a third transistor connected between the aforementioned monitoring node and a second supply voltage terminal that provides a second reference potential at a logic level opposite that of the aforementioned first reference potential; a fourth transistor connected between the aforementioned monitoring node and a third supply voltage terminal that provides a third reference potential at the same logic level as the aforementioned first reference potential; an inverter circuit, the input terminal of which is connected to the aforementioned monitoring node, and the output terminal of which is connected to the control terminal of the aforementioned fourth transistor, and that outputs voltage to the aforementioned output terminal at a logic level opposite that of the voltage input to the aforementioned input terminal; an initialization means that precharges the aforementioned monitoring node to a potential at a logic level for keeping the aforementioned fourth transistor turned on; and a monitor control means that drives the control terminal of the aforementioned third transistor to a prescribed potential after the start of the aforementioned first time to source current between the third supply voltage terminal and the aforementioned monitoring node via the aforementioned third transistor, and that provides a signal for switching from the aforementioned first time to the aforementioned second time to the aforementioned word line potential switching means when the potential of the aforementioned monitoring node reaches a logic level opposite that of the logic level at the time of the aforementioned initialization.

The semiconductor memory device of the present invention should also preferably have a refresh control means that, during a write cycle where the desired data are written to the aforementioned semiconductor memory cell selected in the memory cell array, drives all of the bit lines of the aforementioned memory cell array to a potential with a prescribed logic level for a prescribed time independently of the time during which the aforementioned word line is enabled for writing data to the aforementioned selected semiconductor memory cell, and also drives all of the aforementioned word lines to a prescribed potential makes the aforementioned first transistors in all of the aforementioned semiconductor memory cells conduct. Or it could also have a refresh control means that, during a read cycle during which stored data are read from the aforementioned semiconductor memory cell selected in a memory cell array, drives all the bit lines in the aforementioned memory cell array to a potential at a prescribed logic level for a prescribed time independently of the time during which the aforementioned word line is enabled to read data for the aforementioned semiconductor memory cell, and that also drives all of the word lines to a prescribed potential to make the aforementioned first transistors in all of the aforementioned semiconductor memory cells conduct.

REFERENCE NUMERALS AND SYMBOLS AS SHOWN IN THE DRAWINGS

In the figures, 10 represents PMOS transistor (for transfer gate use), 12 NMOS transistor (for data latching), 14 Inverter circuit, 16 PMOS transistor (of CMOS inverter 14), 18 NMOS transistor (of CMOS inverter 14), 20 NMOS transistor (for transfer gate use), 22 PMOS transistor (for data latching), 24 NMOS transistor (for transfer gate use), 26 NMOS transistor (for data latching), 40 Memory cell array, 44 Control part, 48 Address decoder, 50 Word line driver, 50(0)–50(n), 50(j) Word line drive circuits, (BL0)–(BLn), (BLj) (Memory cell array division) blocks, (MC0)–(MCn) SRAM cell, (UDC) Upper dummy cell, (LDC) Lower dummy cell, 56(0), 56(1) NMOS transistors, 58(0), 58(1) PMOS transistors, 60(0), 60(1) NMOS transistors, 62(0), 62(1) PMOS transistors, 64(0), 64(1) NMOS transistors, 66(0), 66(1) PMOS transistors, 68(0), 68(1) NMOS transistors, 70(0), 70(1) PMOS transistors, (GIO), (GIO−) Global data input/output lines, (UBIT) Upper local data input/output line, (LBIT) Lower local data input/output line, (USL) Upper reference potential line, (LSL) Lower reference potential line, 80 Data input circuit, 90 Sense amplifier, 125 Precharge circuit, 130 State switching part, 132 Refresh control part for active cycles, 134 Refresh control part for standby cycles, 136 Refresh monitor part, 210 Monitor cell, 250 Monitor cell, and 262 Refresh part Embodiments of the present invention will be explained below with reference to FIGS. 1–29.

Figure 1:
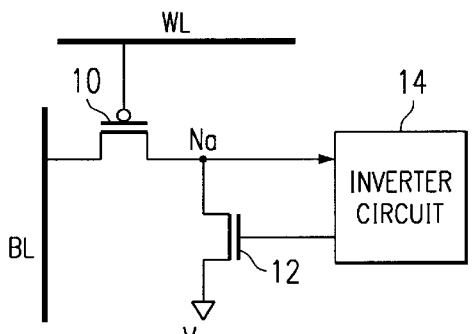
FIG. 1 is a circuit diagram that shows the constitution of an SRAM cell in an embodiment of the present invention.

The constitution of an SRAM cell in one embodiment of the present invention is shown in FIG. 1. This SRAM cell is constituted with two MOS transistors 10 and 12 and one inverter circuit 14. The source terminal of PMOS transistor 10 is connected to bit line (BL), the drain terminal is connected to data storage node (Na), and the gate terminal is connected to word line (WL). The source terminal of NMOS transistor 12 is connected to a supply voltage terminal that provides low-level reference voltage $V_{SS}$ (for example, 0 volts), the drain terminal is connected to data storage node (Na), and the gate terminal is connected to the output terminal of inverter circuit 14. The input terminal of inverter circuit 14 is connected to data storage node (Na).

Figure 2:
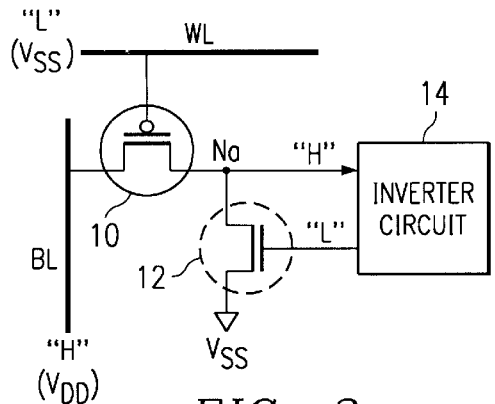
FIG. 2 is a circuit diagram for explaining data (high level) writing in the SRAM cell of the embodiment.

In this SRAM cell, when data for the logical value "1" are written, as shown in FIG. 2, after bit line (BL) is fed or precharged to high-level reference voltage $V_{DD}$ (for example 1.8 V) corresponding to the logical value "1," for example, word line (WL) is driven to an active low-level potential, $V_{SS}$ for example, to turn PMOS transistor 10 on, and the potential of data storage node (Na) is raised by the high-level potential ($V_{DD}$) on bit line (BL). When the potential of data storage node (Na) goes to high level, logically inverted low-level voltage is provided to the gate terminal of NMOS transistor 12 from the output terminal of inverter circuit 14 and NMOS transistor 12 is turned off.

After writing of data for the logical value "1" as described above is completed, as shown in FIG. 3, while the potential of bit line (BL) is held at high level ($V_{DD}$) for standby, the potential of word line (WL) is returned to an inactive state high level, for example, $V_{DD}$, and PMOS transistor 10 is turned off. Thus, data storage node (Na) will be a floating state at a high-level potential, and by latching NMOS transistor 12 in an off state via inverter circuit 14, stored data (high level or "1") in data storage node (Na) are held.

Figure 4:
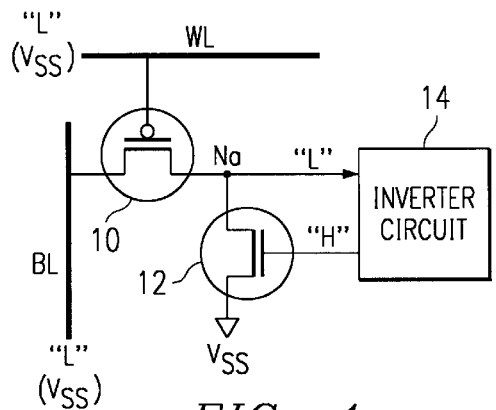
FIG. 4 is a circuit diagram for explaining data (low level) writing in the SRAM cell of the embodiment.

In this SRAM cell, when data for the logical value "0" are written, as shown in FIG. 4, after the potential of bit line (BL) is lowered to a low level ($V_{SS}$) corresponding to the logical value "0," word line (WL) is driven to an active low level ($V_{SS}$) to turn PMOS transistor 10 on and the potential of data storage node (Na) is lowered by the low-level potential ($V_{SS}$) on bit line (BL). When the potential of data storage node (Na) goes to a low level, logically inverted high-level voltage is provided to the gate terminal of NMOS transistor 12 from inverter circuit 14 and NMOS transistor 12 turns on.

After writing data for the logical value "0" as described above is completed, as shown in FIG. 5, while the potential of bit line (BL) is returned to a high level ($V_{DD}$) for standby, the potential of word line (WL) is returned to an inactive state high level ($V_{DD}$) and PMOS transistor 10 is turned off. By latching NMOS transistor 12 in an on state via inverter circuit 14, stored data ("0" or low level) in data storage node (Na) are held.

Figure 5:
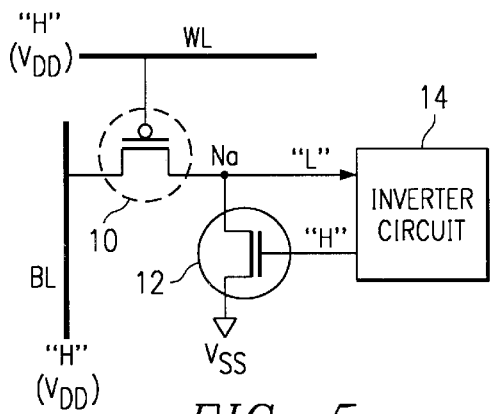
FIG. 5 is a circuit diagram for explaining the state of each part during the standby period after data (low level) writing in the SRAM cell of the embodiment.

In this way, in this SRAM cell, when data for the logical value "0" are stored, NMOS transistor 12 for latching, and that is connected between data storage node (Na) and low-level source voltage $V_{SS}$, is held on, so data storage node (Na) holds low-level potential in a static state (FIG. 5).

Figure 3:
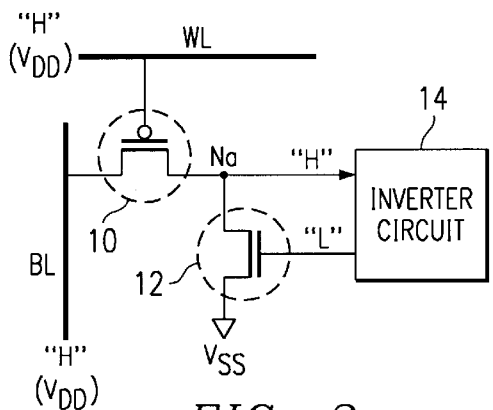
FIG. 3 is a circuit diagram for explaining the state of each part during the standby period after data (high level) writing in the SRAM cell of the embodiment.

On the other hand, when data for the logical value "1" are stored, both of the two transistors 10 and 12 will be off, so data storage node (Na) holds high-level potential in a floating state (FIG. 3). In this case, leakage current $I_{off-N}$ of NMOS transistor 12 acts to lower the potential (high level) of data storage node (Na) toward the low level side. In order to remedy this problem, a method of controlling the processing technology so that the leakage current $I_{off-P}$ of PMOS transistor 10 will be greater than the leakage current $I_{off-N}$ of NMOS transistor 12 (and the lowering of the potential of data storage node (Na) as described above will thereby be cancelled) has been proposed.

Figure 6:
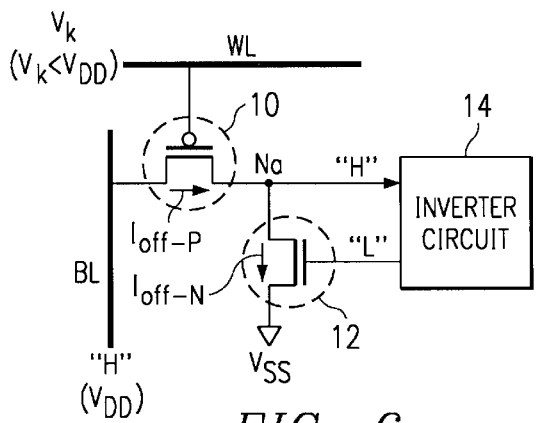
FIG. 6 is a circuit diagram for explaining a refresh method for the SRAM cell of the embodiment.

However, in this embodiment, as shown in FIG. 6, a circuit control technique where the potential of word line (WL) during the standby period is controlled to value $V_K$ that is somewhat shifted from inactive high level reference voltage $V_{DD}$ toward the active low level, and leakage current $I_{off-N}$ of NMOS transistor 12 is cancelled or compensated by leakage current $I_{off-P}$ (or on current) of PMOS transistor 10 is more reliable and effective. This voltage control ($V_{DD} \rightarrow V_K$) of word line (WL) could be accomplished regularly or continually, or periodically or intermittently.

In this SRAM cell, when data are read, the potential of bit line (BL) is precharged to a high level ($V_{DD}$) and word line (WL) is driven to an active low level ($V_{SS}$) to turn PMOS transistor 10 on.

When high-level potential is stored in data storage node (Na), the potential of bit line (BL) remains near the precharge potential ($V_{DD}$), so data for the logical value "1" can be detected (read).

When a low-level potential is stored in data storage node (Na), the potential of bit line (BL) is slightly lowered from the precharge potential ($V_{DD}$), so that data for the logical value "0" can be detected (read) from this change in potential. In this case, large current flows in via PMOS transistor 10, that is on, from bit line (BL). However, the current drive capability of NMOS transistor 12 for data latching is high when on, so that current from bit line (BL) can be rapidly drawn into its source terminal or supply voltage terminal ($V_{SS}$). However, to increase the ability of NMOS transistor 12 to sink current still more, the low-level source voltage connected to the source terminal of this transistor 12 could also be appropriately lowered to a low-level voltage below the regular reference voltage ($V_{SS}$).

Figure 7:
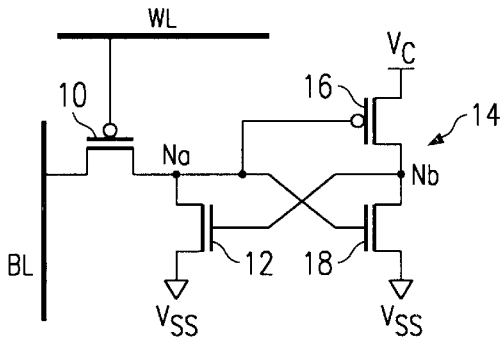
FIG. 7 is a circuit diagram that shows the constitution of the SRAM cell in another embodiment.

As shown in FIG. 7, inverter circuit 14 can be constituted with a CMOS inverter, for example. In this CMOS inverter, each gate terminal of PMOS transistor 16 and NMOS transistor 18 is connected to data storage node (Na) as an input terminal, and node (Nb) between the drain terminals of both transistors 16 and 18 are connected to the gate terminal of NMOS transistor 12 as an output terminal.

With this SRAM cell, when data for the logical value "0" (low level) are written, NMOS transistor 12, which is on, sinks current with a large current drive capability, so high-speed operation can be guaranteed without using any special techniques.

Figure 8:
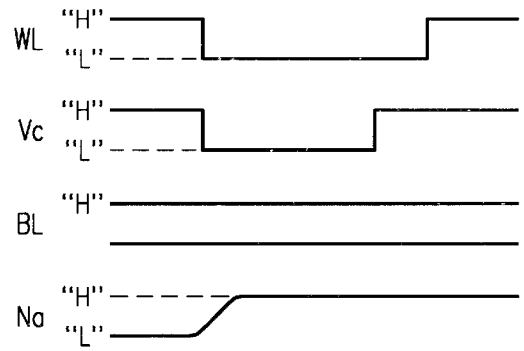
FIG. 8 is a timing diagram for explaining one technique for increasing data write speed in the SRAM cell of the embodiment.

On the other hand, when data for the logical value "1" (high level) are written, the speed at which NMOS transistor 12 is switched from on to off is important. In order to improve this switching or inversion speed, as shown in FIG. 8, a technique where high-level source voltage Vc connected to the source terminal of PMOS transistor 16 is lowered from the regular reference level ($V_{DD}$) toward a low level interlocked with activation of word line (WL) is effective. With this technique, inverter output (potential of Nb) inversion (H→L) is accelerated from source voltage Vc rather than from bit line (BL), the speed at which NMOS transistor 12 is turned off is increased, and the speed at which high-level data can be written to data storage node (Na) can be increased.

Figure 9:
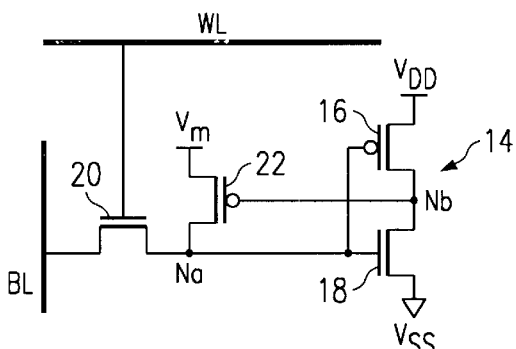
FIG. 9 is a circuit diagram that explains the constitution of the SRAM cell in another embodiment.

The constitution of an SRAM cell in another embodiment of the present invention is shown in FIG. 9. With this SRAM cell, NMOS transistor 20 constitutes a transfer gate and PMOS transistor 22 constitutes the latch part. The source terminal of PMOS transistor 22 is connected to a source voltage terminal that provides high-level potential Vm.

Figure 10:
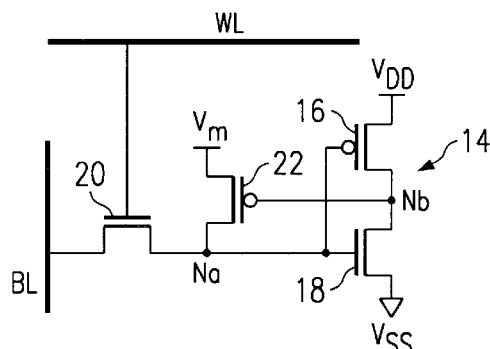
FIG. 10 is a timing diagram for explaining one technique for increasing data write speed in the SRAM cell of the embodiment.

In this SRAM cell, when data for the logical value "1" are written, as shown in FIG. 10, after bit line (BL) is driven to high-level voltage $V_{DD}$, word line (WL) is driven to active high-level potential Vp to turn NMOS transistor 20 on, and the potential of data storage node (Na) is raised to high level by the high-level potential ($V_{DD}$) on bit line (BL). A logically inverted low-level potential is thus provided to the gate terminal of PMOS transistor 22 from the output terminal of inverter 14 and PMOS transistor 22 turns on. Threshold value Vt of NMOS transistor 20 is high, when write current from bit line (BL) is limited, write speed can be improved by making activation voltage Vp of word line (WL) higher than reference source voltage $V_{DD}$ by more than threshold value Vt.

Figure 11:
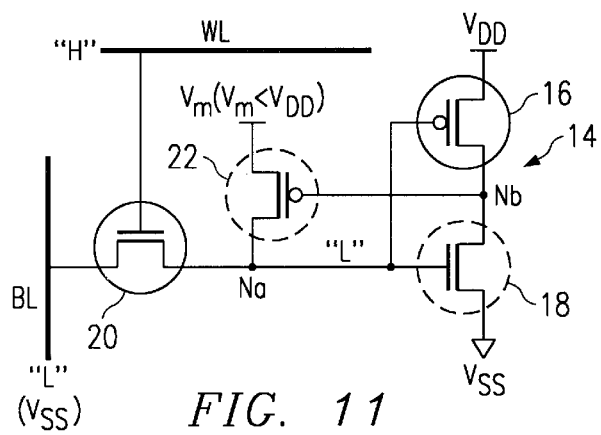
FIG. 11 is circuit diagram for explaining data (low level) writing in the SRAM cell of the embodiment (FIG. 10).

When data for the logical value "0" are written, as shown in FIG. 11, after bit line (BL) is driven to the reference low-level potential ($V_{SS}$), word line (WL) is driven to an active high level ($V_{DD}$ or Vp) to turn NMOS transistor 20 on, and the potential of data storage node (Na) is lowered to a low level by the low-level potential ($V_{SS}$) on bit line (BL). In this way, a logically inverted high-level potential is provided to the gate terminal of PMOS transistor 22 from the output terminal of inverter 14 and PMOS transistor 22 turns on. In order to increase the speed of the write operation, the low-level source voltage connected to the source terminal of NMOS transistor 18 could be raised from the regular reference potential ($V_{SS}$) toward the high level in inverter 14 based on the same principle as the aforementioned technique for FIG. 7 and FIG. 8.

Figure 12:
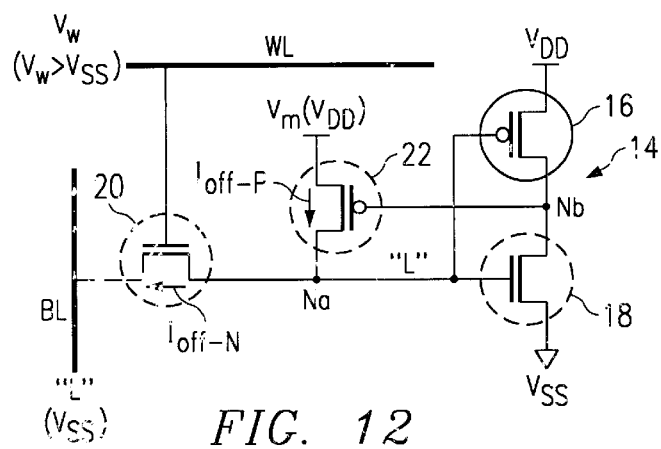
FIG. 12 is a circuit diagram for explaining the state of each part during the standby period after data (low level) writing in the SRAM cell of the embodiment (FIG. 10).

The state of each part during the standby period where data for a logical value "0" are held is shown in FIG. 12. During this standby period, both transistors 20 and 22 will be off, so that data storage node (Na) will be in a floating state at low-level potential.

In this case, leakage current $I_{off-P}$ of PMOS transistor 22 acts to raise the potential (low level) of data storage node (Na) toward the high level. To solve this problem, the aforementioned technique of FIG. 6 can also be applied. That is, by controlling the potential of word line (WL) during the standby period toward value $V_w$ that is appropriately shifted from active low-level reference voltage $V_{SS}$ toward a high level, the effect of lowering the node potential produced by leakage current $I_{off-N}$ (or on current) of NMOS transistor 20 will overcome the effect of raising node potential produced by leakage current off-p of PMOS transistor 22, and the potential or logic level of data storage node (Na) can be reliably held.

Also, even if the ratio W (channel width)/L (channel length) of both MOS transistors 16 and 18 is set so that the trigger point of output (potential of Nb) for input (potential of Na) in CMOS inverter 14 will decrease, the potential or logic level of data storage node (Na) will be stabilized.

Note that when data for the logical value "1" are stored, PMOS transistor 22 for data latching, which is connected between data storage node (Na) and high-level source voltage $V_{DD}$, will be held on. Thus, data storage node (Na) holds high-level potential in a static state.

In this SRAM, when data are read, the potential of bit line (BL) is lowered to low level ($V_{SS}$), word line (WL) is activated to high level ($V_{DD}$) and NMOS transistor 20 is turned on.

When a low-level potential is stored in data storage node (Na), the potential of word line (WL) will remain at low level and data for the logical value "0" are detected (read).

When a high-level potential is stored in data storage node (Na), data for the logical value "1" are detected (read) by PMOS transistor 22 for data latching, which is on, raising the potential of word line (WL) via NMOS transistor 20 toward high level. In this case, when the capacitance of bit line (BL) is large and an increase in potential to high level is not easy, a technique where the drive voltage for word line (WL) is set to a higher value Vp than high-level reference voltage $V_{DD}$, or a technique where the potential of the source terminal of PMOS transistor 22 is further set to a higher value than reference voltage $V_{DD}$ is effective.

Figure 13:
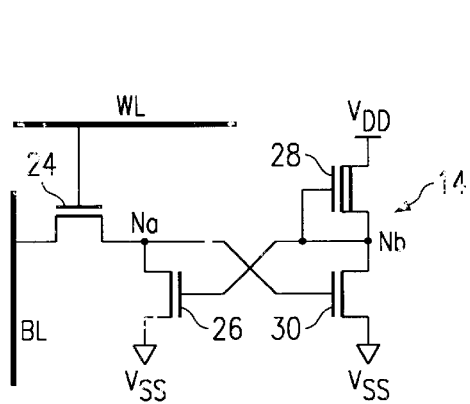
FIG. 13 is a circuit diagram that shows the constitution of the SRAM cell in another embodiment.

The constitution of an SRAM cell in still another embodiment is shown in FIG. 13. With this SRAM cell, NMOS transistor 24, which is connected between data storage node (Na) and bit line (BL), constitutes a transfer gate. NMOS transistor 26, which is connected between data storage node (Na) and low-level supply voltage ($V_{SS}$), constituted a data latch part. NMOS transistors 28 and 30 constitute inverter circuit 14. In inverter circuit 14, NMOS transistor 28 is a depletion mode type that is normally on, its gate terminal and drain terminal (node Nb) are cross-connected, and it functions as a load transistor.

In this SRAM cell, when data for the logical value "1" are written, for example, after power is supplied to high-level reference potential $V_{DD}$ of bit line (BL), word line (WL) is driven to active high-level potential ($V_{DD}$ or Vp) to turn NMOS transistor 24 on, and the potential of data storage node (Na) is raised to high level by the high-level potential ($V_{DD}$) on bit line (BL). In this way, NMOS transistor 30 turns on in inverter 14, low-level voltage is provided to the gate terminal of NMOS transistor 26 from the output terminal (Nb), and NMOS transistor 26 turns off. Here, too, when threshold voltage Vt of NMOS transistor 24 is high and the write current from bit line (BL) is limited, the speed of the write operation can be increased by making activation voltage Vp of word line (WL) higher than reference voltage $V_{DD}$ by more than threshold voltage Vt.

Figure 14:
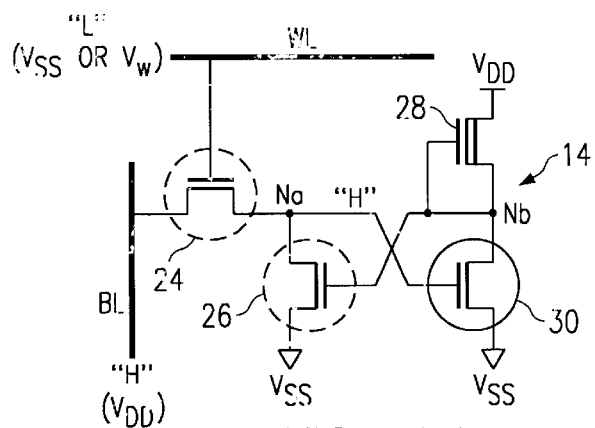
FIG. 14 is a circuit diagram for explaining the state of each part in the standby period after data (high level) writing in the SRAM cell of the embodiment (FIG. 13).

The state of each part during the standby period where data for the logical value "1" are held in this SRAM cell is shown in FIG. 14. During this standby period, both transistors 24 and 26 will be off, so that data storage node (Na) holds a high-level potential in a static state. Here, too, by controlling the potential of word line (WL) to value Vp that is somewhat shifted from inactive low-level reference voltage $V_{SS}$ toward an active high level during the standby period, leakage current $I_{off-N}$ of NMOS transistor 24 will cancel leakage current $I_{off-N}$ of NMOS transistor 26 and the potential or logic level of data storage node (Na) can be held reliably.

As described above, the SRAM cell based on the present invention is constituted with four transistors. Compared to a conventional general-purpose six-transistor SRAM, the layout area is significantly reduced (about 75%), and a large-capacity, high-density SRAM can be realized. Furthermore, as described above, for one logical data value, it is a completely static type, and at the same time, for the other logical value, while it is a floating or dynamic type, reliable data holding or storage can be guaranteed with circuit control (or process control). High-speed and highly reliable operation can also be guaranteed when reading or writing data.

Next, an SRAM in one embodiment of the present invention will be explained for FIGS. 15–28.

Figure 15:
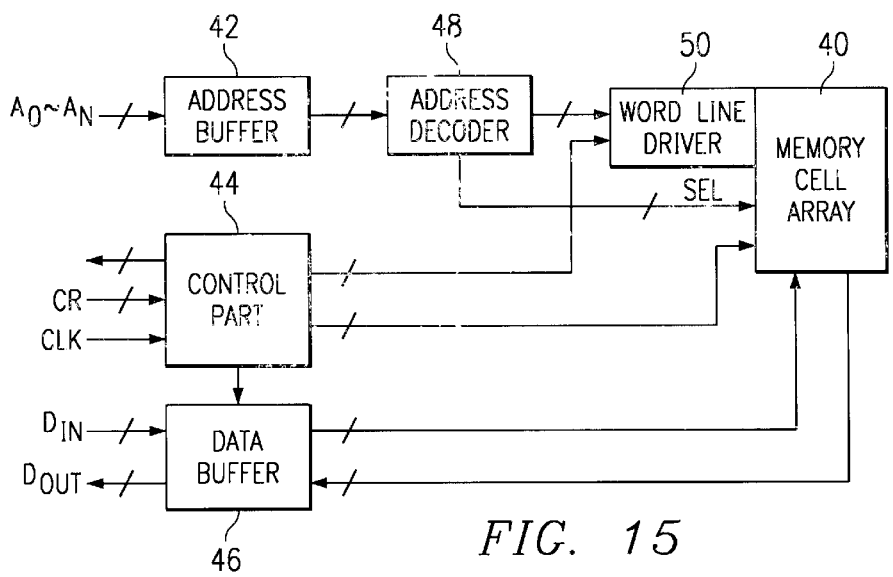
FIG. 15 is a block diagram that shows the constitution of the SRAM in one embodiment.

The constitution of the SRAM in this embodiment is shown in FIG. 15. This SRAM has memory cell array 40, address buffer 42, control part 44, data buffer 46, address decoder 48, and word line driver 50 formed as an integrated circuit on the same semiconductor chip. Memory cell array 40 is constituted with SRAM cells of the present invention as described above.

With memory access to this SRAM, addresses $A_O$–$A_N$ of a specific number of bits is input to address buffer 42 by external circuitry (not shown), and a specific control signal CR is also provided to control part 44. When this memory is accessed to write data, data $D_{IN}$ of a specific number of bits from the outside is stored in memory cell array 40 via data buffer 46. When data is read, data $D_{OUT}$ with the aforementioned number of bits is output externally from memory cell array 40 via data buffer 46.

Address decoder 48 is constituted to decode input addresses $A_O$–$A_N$ and provide a signal for selecting or activating any one of the word lines (WL) in memory cell array 40 to word line driver 50, as well as selecting any one or multiple bit lines (BL) in memory cell array 40 via a data input/output select line (SEL), discussed below.

Figure 16:
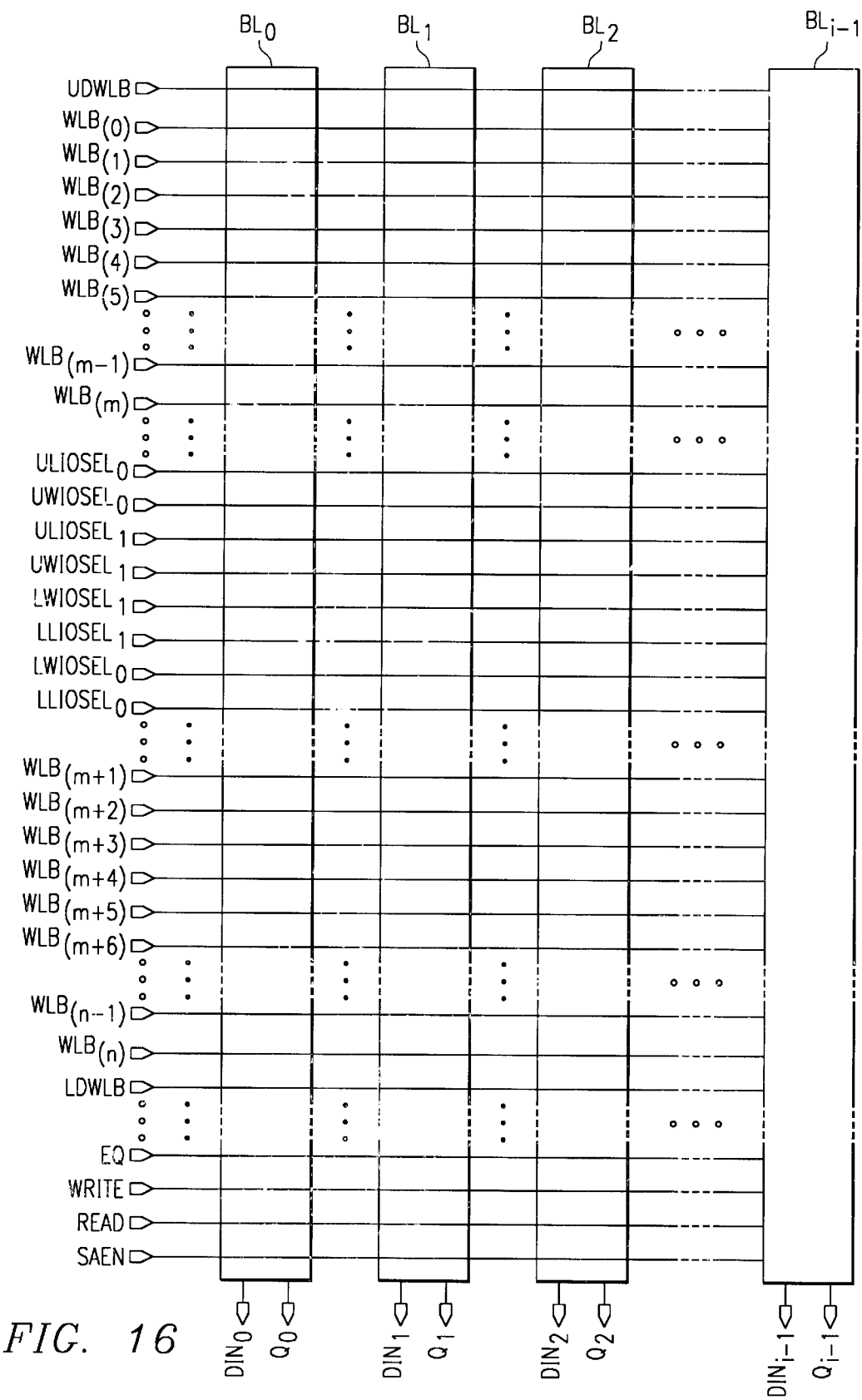
FIG. 16 is a block diagram that shows the constitution of the memory cell array in the SRAM of the embodiment.

An example of the constitution of memory cell array 40 is shown in FIG. 16. This memory cell array 40 is divided into multiple blocks (BL0)–(BLi–1) equal to the number of bits (i) in the data. It allocates and stores one data unit per block (BL0)–(BLi–1) bit by bit. When data are written, each bit of data unit DIN0–DINi–1 that constitutes input data $D_{IN}$ is simultaneously written to one memory cell in each block (BL0)–(BLi–n) whose address is specified. When data are read, each bit of data Q0–Qi–1 read simultaneously from one memory cell in each block (BL0)–(BLi–1n) is combined to give output data $D_{OUT}$.

A specific number (n+1) of word lines WLB0–WLB(n) intersects and is wired to blocks (BL0)–(BLi–1). Of these, the first half portion of (WLB0)–(WLBm) intersects the upper region of each block (BL) and the latter half portion (WLBm+1)–(WLBn) intersects the lower region of each block (BL). Thus, dummy cell selection lines (ULWLB) and (LDWLB) for activating dummy cells, discussed below, which provide comparison reference voltage when data are read, intersect and are wired to the outside end parts of the upper region and lower region.

Data input/output select lines (IOSEL) for selecting specific bit lines during memory access are divided into an upper region portion (ULIOSEL0, UWIOSEL0, ULIOSEL1, UWIOSEL1) and lower region portion (LLIOSEL0, LWIOSEL0, LLIOSEL1, LWIOSEL1), and each intersects and is wired to the center part of blocks (BL0)–(BLi–1). Control lines WRITE, READ, EQ, SEAN, for controlling data input circuit or sense amplifier operation, discussed below, intersect and are wired to the bottommost part of blocks (BL0)–(BLi–1).

Figure 17A:
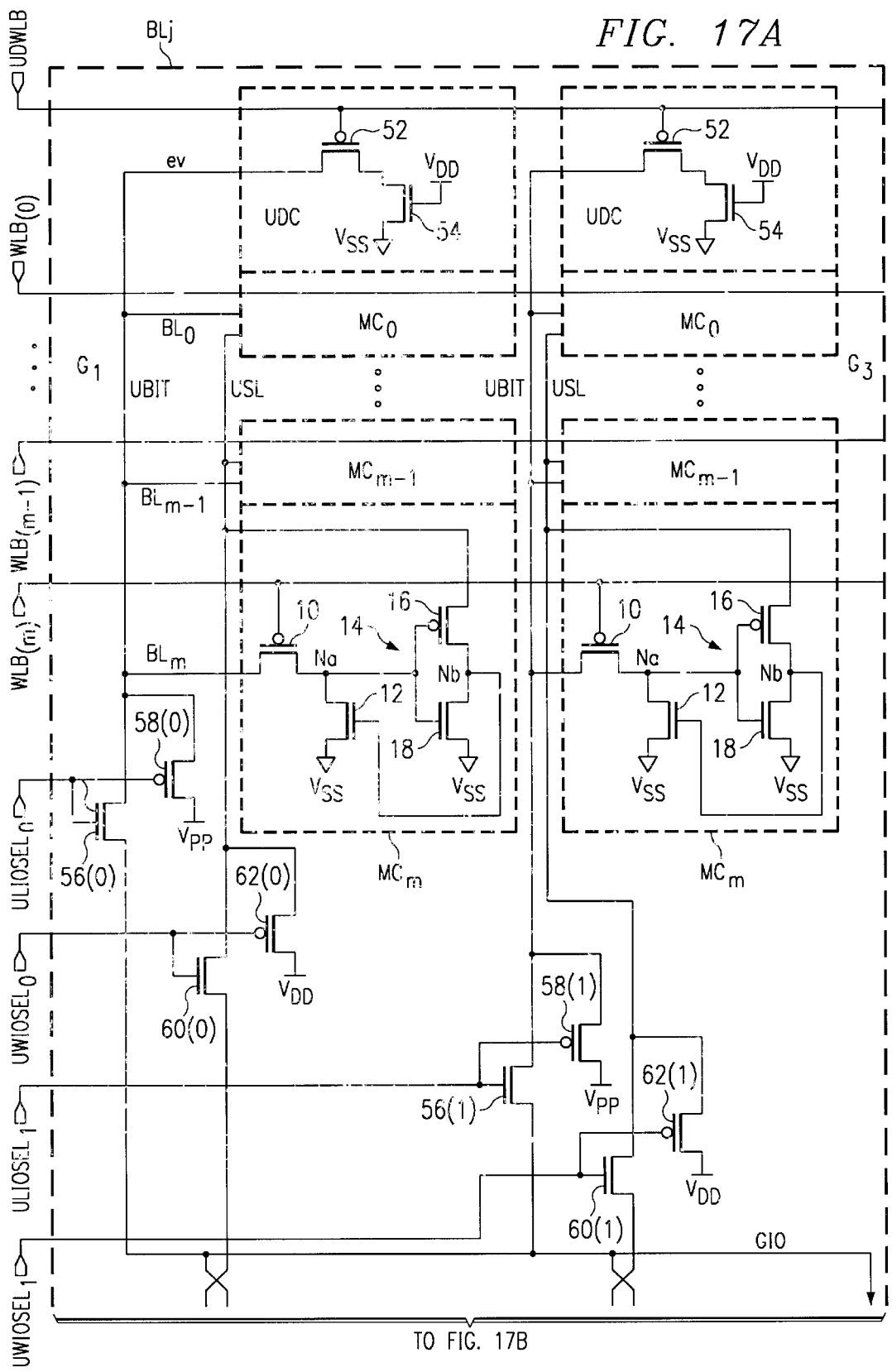
FIG. 17 is a circuit diagram that shows the constitution in each block that constitutes the memory cell array in the SRAM of the embodiment.
Figure 17B:
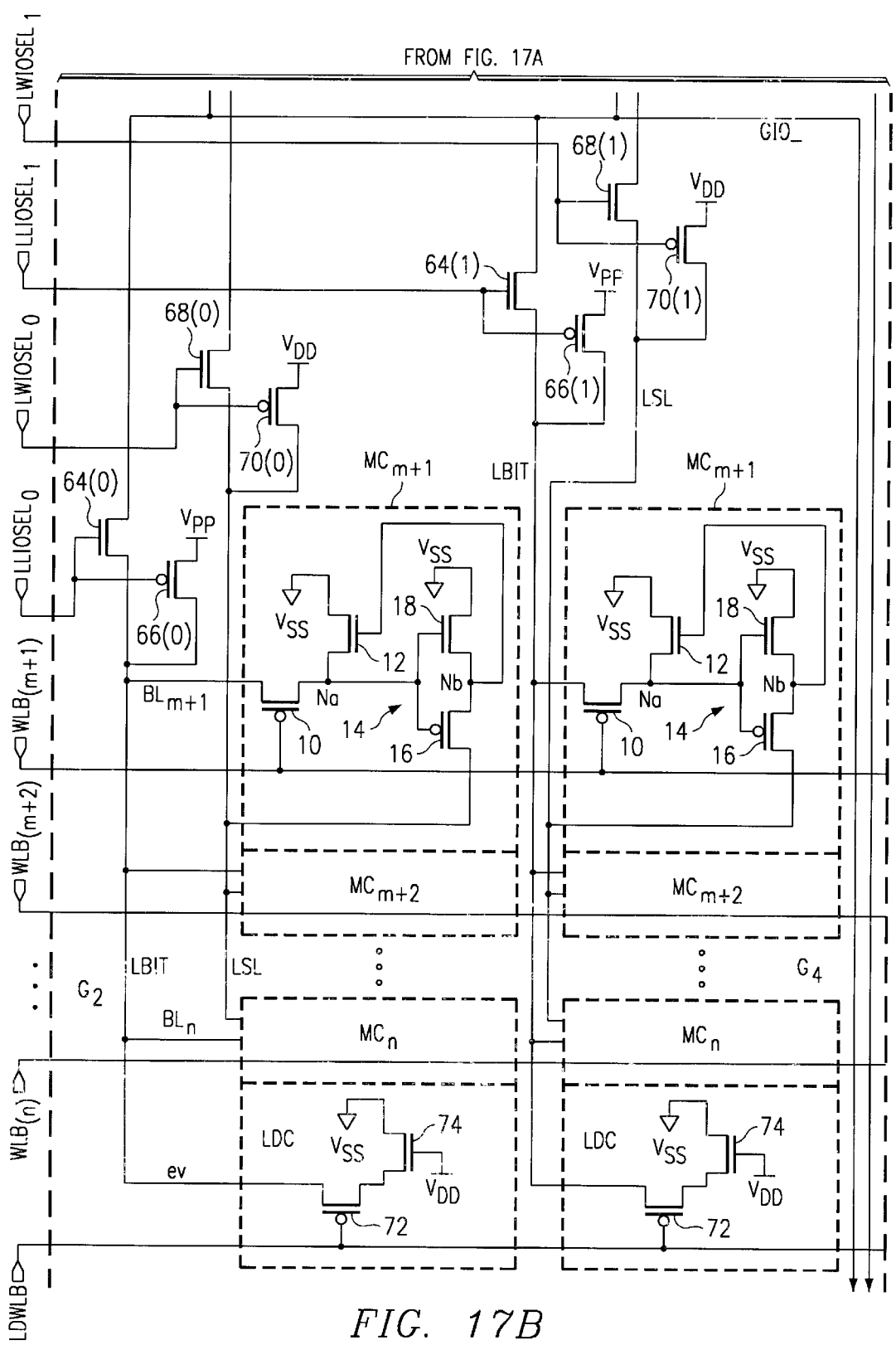
Figure 18:
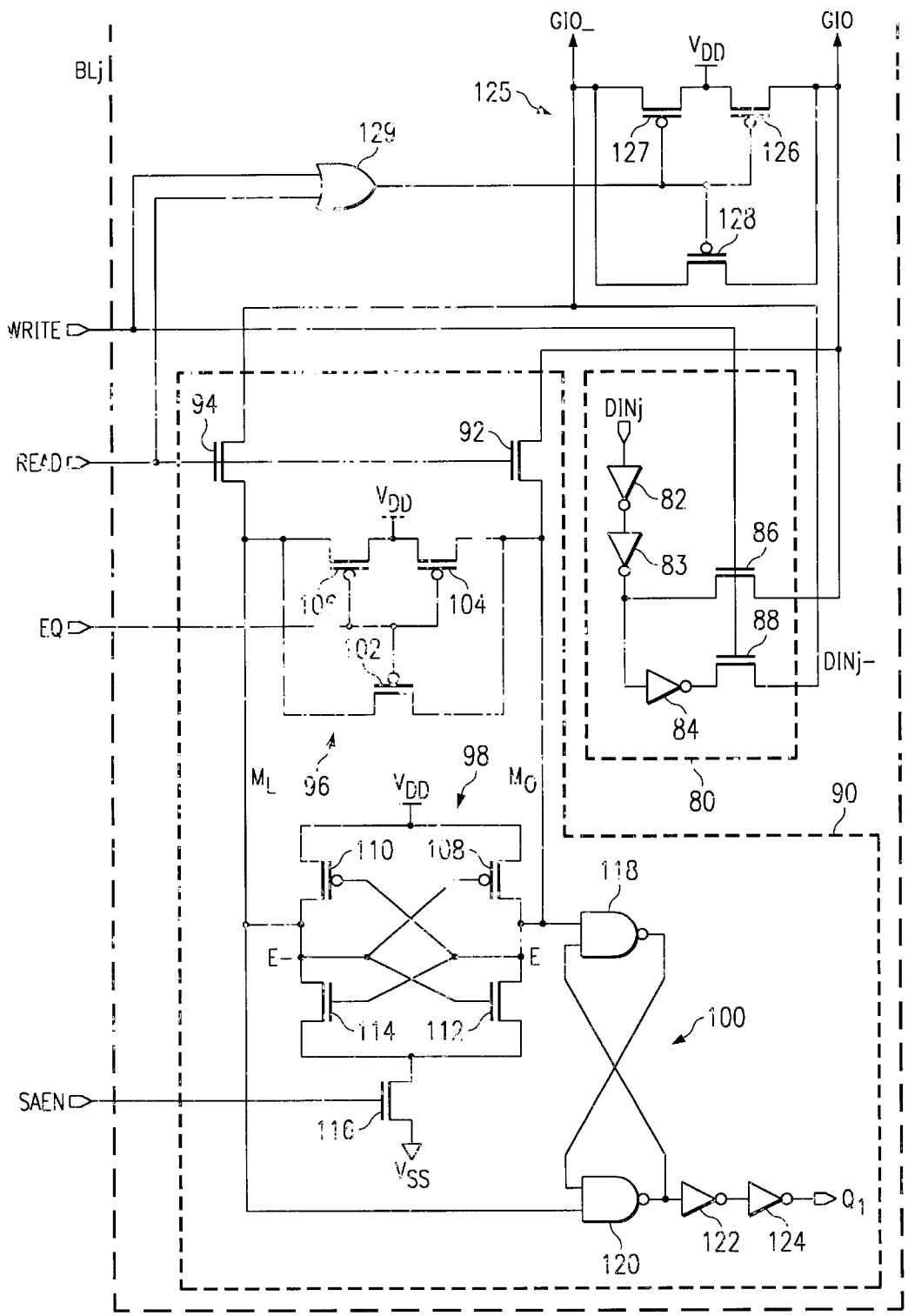
FIG. 18 is a circuit diagram that shows the constitution in each block that constitutes the memory cell array in the SRAM of the embodiment.

An example of the circuit configuration in each block (BLj) j=0, 1, . . . n) that forms memory cell array 40 is shown in FIG. 17 and FIG. 18. As shown in FIG. 17, in each block (BLj), a specific number of cells is divided in half vertically and horizontally and form four groups G1, G2, G3, and G4.

In the upper two groups G1 and G3, upper dummy cell (UDC) and SRAM cells (MC0)–(MCm) are arranged in a vertical column at a position through which upper dummy cell selection line (UDWLB) and upper word lines (WLB0–WLBm) pass. The constitution of each SRAM cell (MC0)–(MCm) could be analogous to the constitution in FIG. 7, for example. In each SRAM cell (MC0)–(MCm), bit lines (BL0)–(BLm) are connected in common to upper local data input/output line (UBIT). The gate terminal of PMOS transistor 10 for transfer gate use is individually connected to each corresponding word line (WLB0)–(WLBm). The source terminal of PMOS transistor 16 of inverter circuit 14 is connected in common to upper reference potential line (USL).

Upper local data input/output line (UBIT) is connected to the output terminal of upper dummy cell (UDC). It can also be connected to first global data input/output line (GIO) via NMOS transistors 56(0) and 56(1), and can further be connected to lower reference potential line (LSL) in lower groups G2 and G4 via NMOS transistors 68(0) and 68(1).

Upper local data input/output line (UBIT) can also be connected to high-level supply voltage $V_{DD}$ for precharging via PMOS transistors 58(0) and 58(1). Data input/output select line (ULIOSEL0) is connected to the gates of NMOS transistor 56(0) and PMOS transistor 58(0). Data input/output select line (ULIOSEL1) is connected to the gates of NMOS transistor 56(1) and PMOS transistor 58(1).

Upper reference potential line (USL) can also be connected to second global data input/output line (GIO–) via NMOS transistors 60(0) and 60(1), and can further be connected to lower local data input/output line (LBIT) in lower groups G2 and G4 via NMOS transistors 64(0) and 64(1). Upper reference potential line (USL) can also be connected to high-level supply voltage $V_{DD}$ for precharging via PMOS transistors 62(0) and 62(1). Data input/output select line (UWIOSEL0) is connected to the gates of NMOS transistor 60(0) and PMOS transistor 62(0). Data input/output select line (UWIOSEL1) is connected to the gates of NMOS transistor 60(1) and PMOS transistor 62(1).

Upper dummy cell (UDC) is constituted of PMOS transistor 52 and NMOS transistor 54. More specifically, the drain terminal of NMOS transistor 54 is cross-connected with the drain terminal of PMOS transistor 52, its source drain is connected to a low-level reference potential, for example, a $V_{SS}$ supply voltage terminal, and its gate terminal is connected to a high-level reference potential, for example, a $V_{DD}$ supply voltage terminal. The drain terminal of PMOS transistor 52 is cross-connected with the drain terminal of NMOS transistor 54 as stated above, its source terminal is connected to upper local data input/output line (UBIT) as a comparison reference voltage output terminal, and its gate terminal is connected to upper dummy cell selection line (UDWLB).

In the lower two groups G2 and G4, SRAM cells (MCm+1)–(Mcn) and lower dummy cell (LDC) are arranged in a vertical column at a position through which lower word lines (WLBm+1)–(WLBn) and lower dummy cell selection line (LDWLB) pass. The constitution of each SRAM cell (MCm+1)–(MCn) could be the same as the constitution of upper SRAM cells (MC0)–(MCm). In each SRAM cell (MCm+1)–MCn), bit lines (BLm+1)–BLn) are connected in common to lower local data input/output line (LBIT). The gate terminal of PMOS transistor 10 for transfer gate use is connected individually to each corresponding word line (WLBm+1)–(WLBn). The source terminal of PMOS transistor 16 of inverter circuit 14 is connected in common to lower reference potential line (LSL).

Lower local data input/output line (LBIT) is connected to the output terminal of lower dummy cell (LDC). It can also be connected to second global data input/output (GIO–) via NMOS transistors 64(0) and 64(1), and can further be connected to upper reference potential line (USL) in upper groups G1 and G3 via NMOS transistors 60(0) and 60(1).

Lower local data input/output line (LBIT) can also be connected to high-level supply voltage $V_{DD}$ for precharging via PMOS transistors 66(0) and 66(1). Data input/output select line (LLIOSEL0) is connected to the gates of NMOS transistor 64(0) and PMOS transistor 66(0). Data input/output select line (LLIOSEL1) is connected to the gates of NMOS transistor 64(1) and PMOS transistor 66(1).

Lower reference potential line (LSL) can be connected to first global data input/output line (GIO) via NMOS transistors 68(0) and 68(1) and can further be connected to upper local data input/output line (UBIT) in upper groups G1 and G3 via NMOS transistors 56(0) and 56(1) for switching. Lower reference potential line (LSL) can also be connected to high-level supply voltage $V_{DD}$ for precharging via PMOS transistors 70(0) and 70(1). Data input/output select line (LWIOSEL0) is connected to the gates of NMOS transistor 68(0) and PMOS transistor 70(0), and data input/outputs select line (LLIOSEL 1) is connected to the gates of NMOS transistor 68(1) and PMOS transistor 70(1).

Lower dummy cell (LDC) is constituted of PMOS transistor 72 and NMOS transistor 74. More specifically, the drain terminal of NMOS transistor 74 is cross-connected to the drain terminal of PMOS transistor 72, the source terminal is connected to low-level reference voltage $V_{SS}$, and the gate terminal is connected to high-level reference voltage $V_{DD}$. The drain terminal of PMOS transistor 72 is cross-connected to the drain terminal of NMOS transistor 74 as described above, the source terminal is connected to lower local data input/output line (LBIT) as comparison reference voltage output terminal, and the gate terminal is connected to lower dummy cell selection line (LDWLB). PMOS transistor 72 and NMOS transistor 74 could have the same characteristics as PMOS transistor 52 and NMOS transistor 54, respectively, in upper dummy cell (LDC).

As shown in FIG. 18, data input circuit 80 and sense amplifier 90 are furnished for the lowermost part of each block (BLj).

Data input circuit 80 has two-stage inverters 82 and 83 that constitute a driver circuit, inverter 84 that constitutes an inverter circuit, and a pair of NMOS transistors 86 and 88 for transfer gate use. Control signal WRITE for writing is furnished to the gate terminals of both NMOS transistors 86 and 88. When this control signal WRITE becomes high level both NMOS transistors 86 and 88 turn on. Corresponding input bit data $DIN_j$ from data buffer 46 will be fed to first global data input/output line (GIO) via NMOS transistor 86 from driver circuits 82 and 83. Simultaneously, inverted bit data DINJ, in which this input bit data DINj has been logically inverted, will be fed to second global data input/output line (GIO−) via NMOS transistor 88 from inverter 84. When control signal WRITE is at a low level, both NMOS transistors 86 and 88 are off, and data input circuit 80 is electrically separated from global data input/output lines (GIO) and (GIO−).

Sense amplifier 90 is constituted with transfer gates 92 and 94, precharge circuit 96, amplifier circuit 98, and data output circuit 100. Transfer gates 92 and 94 are composed of NMOS transistors, and control signal READ for reading is provided to these gate terminals. When this control signal READ goes to the low level, both transfer gates 92 and 94 are off, and the pair of data input/output lines (MO) and (MO−) in the sense amplifier are electrically separated from their respective global data input/output lines (GIO) and (GIO−). When control signal READ goes to the high level, both transfer gates 92 and 94 will be on, and both data input/output lines (MO) and (MO−) in the sense amplifier are electrically connected to their respective global data input/output lines (GIO) and (GIO−).

Precharge circuit 96 is composed of a pair of PMOS transistors 104 and 106, each of which is connected between the two data input/output lines (MO) and (MO−) of the sense amplifier and high-level supply voltage $V_{DD}$ for precharging, and of PMOS transistor 102 for equalizing the charge is connected between both data input/output lines (MO) and (MO−); control signal EQ for equalizing the charge is applied to the gate terminal of each transistor. When this control signal EQ goes to the low level, each transistor 102, 104, and 106 turns on and high-level supply voltage $V_{DD}$ is fed to both data input/output lines (MO) and (MO−) of the sense amplifier. When control signal EQ goes to the high level, each transistor 102, 104, and 106 turns off and both data input/output lines (MO) and (MO−) are electrically separated from precharging source voltage $V_{DD}$ and go to the high impedance state.

Amplifier circuit 98 is a latching type with a pair of CMOS inverters cross-coupled and cross-connected. The cross-coupled pair of nodes (E) and (E−) are electrically connected to data input/output lines (MO) and (MO−), respectively. The source terminals of both PMOS transistors 108 and 110 are connected to high-level supply voltage $V_{DD}$, and the source terminals of both NMOS transistors 112 and 114 are connected to low-level supply voltage $V_{SS}$ via NMOS transistor 116 for switching. When enable signal SEAN goes to the high level, amplifier circuit 98 is activated when NMOS transistor 116 turns on, and the potential at nodes (E) and (E−) or data input lines (MO) and (MO−) will be differentially amplified (sensed).

Data output circuit 100 includes a pair of NAND gates 118 and 120 that are cross-coupled and cross-connected and two-stage inverters 122 and 124 that constitute an output buffer. It latches the logic level of the potential obtained at node (E) of amplifier circuit 98 or data input/output line (MO) and outputs 1 bit of read data Qj.

As shown in FIG. 18, precharge circuit 125 is also furnished for global data input/output lines (GIO) and (GIO−). This precharge circuit 125 is composed of a pair of PMOS transistors 126 and 127 that are each connected between global data input/output lines (GIO) and (GIO−) and high-level source voltage $V_{DD}$ for precharging, and PMOS transistor 128 for equalizing the charge is connected between both global input/output lines (GIO) and (GIO−); control signal WRITE for writing and control signal READ for reading are provided via OR gate 129 to each of their gate terminals. During periods when either of these control signals WRITE or READ is at the inactive low level, all transistors 126, 127, and 128 are kept on, and high-level supply voltage $V_{DD}$ is supplied to both global data input/output lines (GIO) and (GIO−). When either control signal WRITE or READ is at the active high level, all transistors 126, 127, and 128 turn off, and both global data input/output lines (GIO) and (GIO−) are electrically separated from precharging source voltage $V_{DD}$ and go to the high impedance state.

Figure 19:
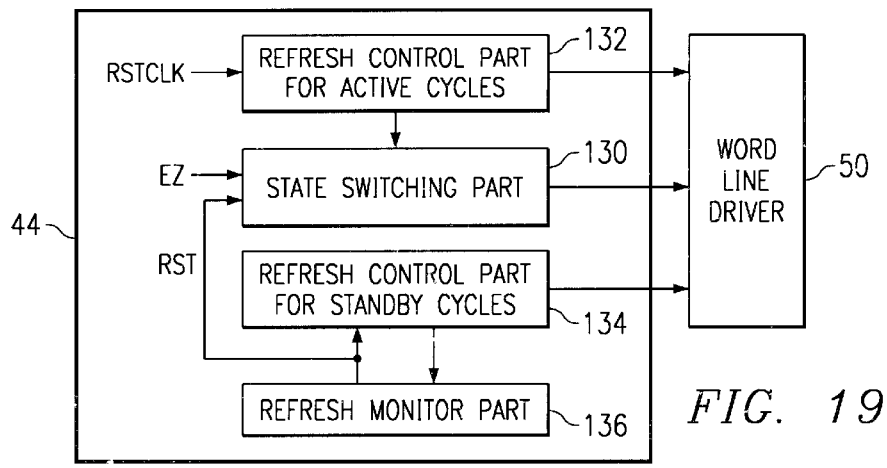
FIG. 19 is a block diagram that shows the constitution of the refresh part in the SRAM of the embodiment.

Control part 44 in this embodiment is furnished with a memory refresh function for reliably maintaining data stored in each memory cell (MC) of memory cell array 40. As shown in FIG. 19, control part 44 for this refresh function has state switching part 130 for selectively switching word line driver 50 to a refresh enable state or a refresh reset state, first refresh control part 132 for controlling the refresh operation during memory access or an active cycle, second refresh control part 134 for controlling the refresh operation during a standby cycle, and refresh monitor part 136 for monitoring the refresh conditions in a standby cycle.

Figure 20:
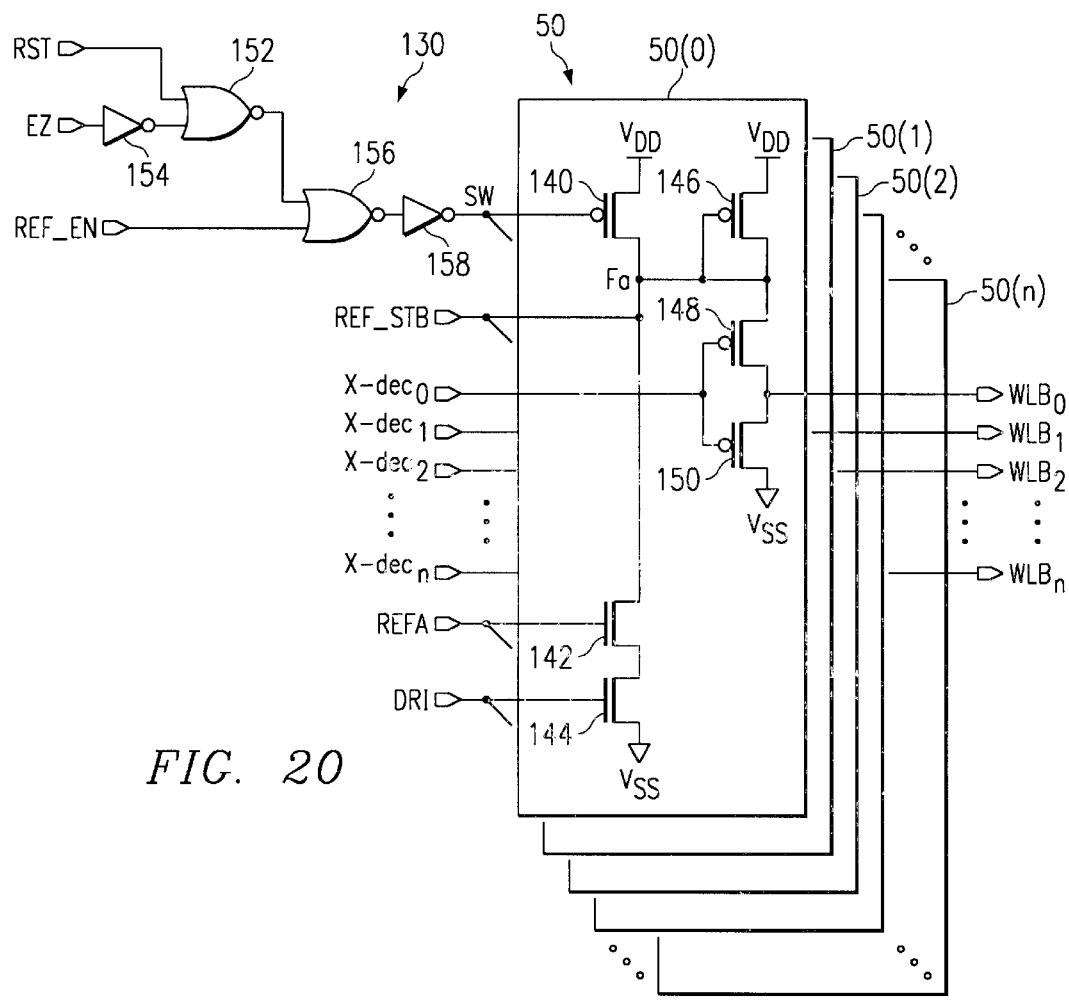
FIG. 20 is a circuit diagram that shows the constitution of the state part and word line part in the SRAM of the embodiment.

An example of circuit configuration for state switching part 130 and word line driver 50 is shown in FIG. 20. Word line driver 50 includes drive circuit 50(1)–50(n) for individually driving word lines (WLB0)–(WLBn), respectively, wired in memory cell array 40.

Each drive circuit 50(j) contains series-connected PMOS transistor 140 and NMOS transistors 142 and 144, and series-connected PMOS transistors 146 and 148 and NMOS transistor 150 between high-level supply voltage $V_{DD}$ and low-level supply voltage $V_{SS}$.

PMOS transistor 140 is a drive transistor for raising the potential of each word line (WLBj) to high-level supply voltage $V_{DD}$ via PMOS transistor 148. State switching signal SW is provided from state switching part 130 to its gate terminal. Word line drive output line (REF-STB) for refreshing from second refresh control part 134 (FIG. 22), discussed below, is connected to node (Fa) at the drain terminal side of PMOS transistor 140. NMOS transistor 142 is a drive transistor for changing the potential of each word line (WLBj) from high-level supply voltage $V_{DD}$ to low level via PMOS transistor 148 for refresh during an active cycle. Refresh control signal REFA is provided to its gate terminal from first refresh control part 132 (FIG. 21), discussed below. NMOS transistor 144 constitutes a constant current circuit for limiting drive current that flows when NMOS transistor 142 is conducting to a prescribed value. Current drive signal DRI is provided to its gate terminal from drive voltage generation circuit 176 (FIG. 21), discussed below.

NMOS transistor 150 is a drive transistor for lowering each word line (WLBj) to active low-level supply voltage $V_{SS}$. PMOS transistor 148 is a switch for switching the potential of each word line (WLBj) from low level to high level. Each corresponding word line selection signal x-dec(j) from address decoder 48 is provided to the gate terminals of both transistors 148 and 150. The supply terminal of PMOS transistor 146 is connected to high-level source voltage $V_{DD}$, and the gate terminal and drain terminal are cross-connected and connected to word line drive node (Fa). This PMOS transistor 146 constitutes a failsafe circuit. It normally maintains the off state. If the potential of word line drive node (Fa) drops too far and reaches prescribed lower limit during a refresh operation, it turns on to restore the potential of node (Fa) to the high-level reference level $V_{DD}$.

Note that word line driver 50 also includes a dummy cell drive circuit (not shown) for selectively activating upper dummy sell selection line (UDWLB) and lower dummy cell selection line (LDWLB). At the same time, when any one of word lines (WLB) is selected and activated during a data read cycle, the dummy cell drive circuit will selectively drive either upper dummy cell selection line (UDWLB) or lower dummy cell selection line (LDWLB) to the active low level ($V_{SS}$) according the position in the block of the selected word line (WLB).

More specifically, when the selected word line (WLB) is positioned in the upper region in block (BL), when it is in any of upper word lines (WLB0)–(WLBm), lower dummy cell selection line (LDWLB) on the opposite side is driven to the active-low level ($V_{SS}$) and specific comparison reference voltage ev is generated from lower dummy cell (LDC). And when the selected word line (WLB) is positioned in the lower region in block (BL), that is, when it is in any of lower word lines (WLBm+1)–(WLBn), upper dummy cell selection line (UDWLB) on the opposite side is driven to the active-low level ($V_{SS}$) and specific comparison reference voltage ev will be generated from upper dummy cell (UDC).

State switching part 130 comprises NOR gates 152 and 156 and inverter circuits 154 and 158. Reset signal RST from refresh monitor part 136 (FIG. 23), discussed below, is provided to one input terminal of NOR gate 152. Mode flag or status signal EZ that indicates the state of the current memory cycle (active cycle/standby cycle) is provided to the input terminal of inverter circuit 154 from a specific circuit (not shown) in control part 44. The output terminal of inverter circuit 154 is connected to the other input terminal of NOR gate 152 and the output terminal of NOR gate 152 is connected to one input terminal of NOR gate 156. Refresh enable control signal REF-EN is provided to the other input terminal of NOR gate 156 from first refresh control part 132 (FIG. 21).

In state switching part 130, refresh enable control signal REF-EN will be of the high level only when first refresh control part 132 performs a refresh operation, and at other times it is kept at the low level. Status signal EZ maintains the low level during active cycles and the high level during standby cycles. Reset signal RST from refresh monitor part 136 maintains the low level during active cycles and goes to the high level temporarily only when refresh is cyclically reset during standby cycles.

Figure 21:
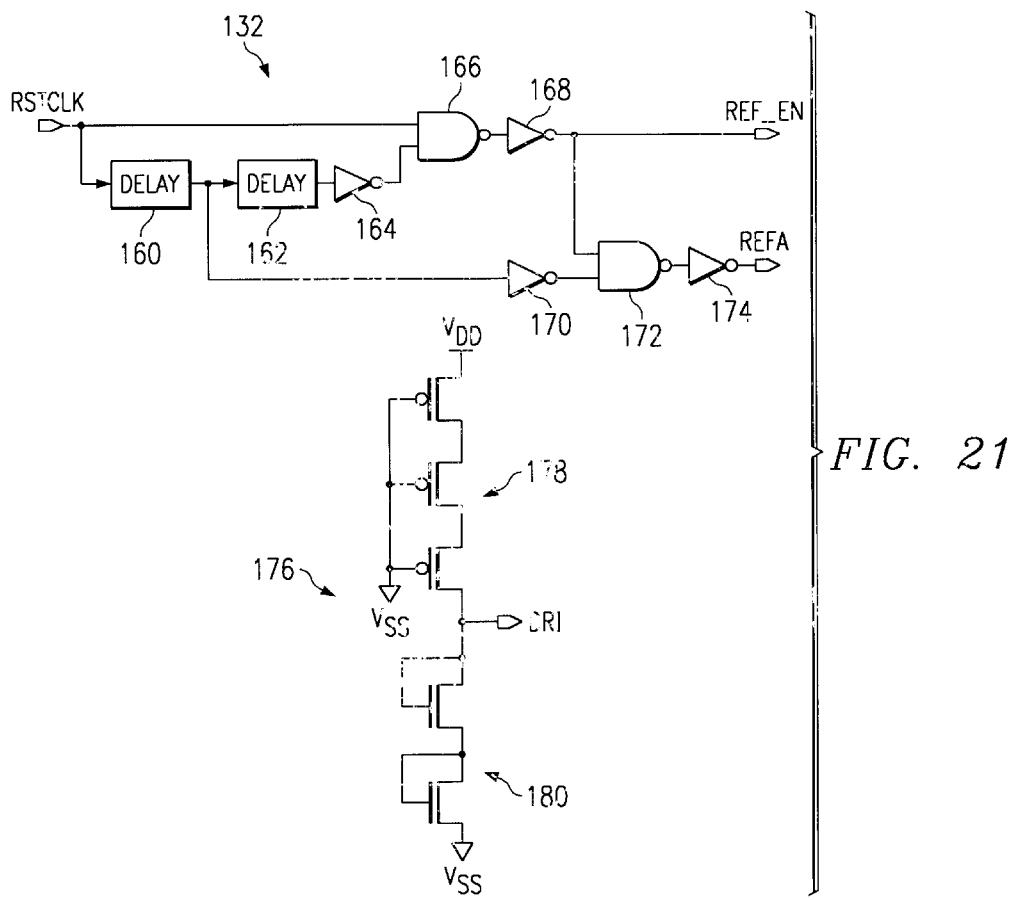
FIG. 21 is a circuit diagram that shows the constitution of the refresh control part for active cycles in the SRAM of the embodiment.

An example circuit configuration for first refresh control part 132 for an active cycle is shown in FIG. 21. Refresh activation signal RSTCLK input to this refresh control part 132 normally maintains a low level, but it goes to a high level for only a fixed time in order to trigger a refresh operation immediately after each data write or read operation is completed in an active cycle.

Normally, when RSTCLK is maintained at a low level, refresh enable signal REF-EN and refresh control signal REFA obtained at the output terminals of each inverter circuit 168 and 174 are also kept at a low level.

However, when memory is accessed and refresh activation signal RSTCLK becomes high level immediately after completion of the write or read operation, refresh enable signal REF-EN temporarily becomes high level for a time period that accounts for the delay time due to delay circuits 160 and 162 from the high-level rise point. At the same time, refresh control signal REFA temporarily becomes high level only for a time equal to the delay time of delay circuit 160.

An example circuit configuration for drive voltage generation circuit 176 for supplying current drive signal DRI to NMOS transistor 144 for constant current in each word line drive circuit 50(j) is shown in FIG. 21. In this drive, voltage generation circuit 176, one or more PMOS transistors 178 and one or more NMOS transistors 180 are connected in series. The source terminal of a PMOS transistor 178 at one end is connected to high-level supply voltage $V_{DD}$, and the source terminal of NMOS transistor 180 at the other end is connected to low-level supply voltage $V_{SS}$. Then, the gate terminal of each PMOS transistor 178 is connected to low-level supply voltage $V_{SS}$, and the gate terminal and drain terminal of each NMOS transistor 180 are interconnected. With this configuration, the PMOS transistors 178 function as drive transistors, and NMOS transistors 180 as load transistors, and fixed-voltage drive signal DRI set between $V_{DD}$ and $V_{SS}$ is obtained from the node connecting these two sets of transistors.

Figure 22:
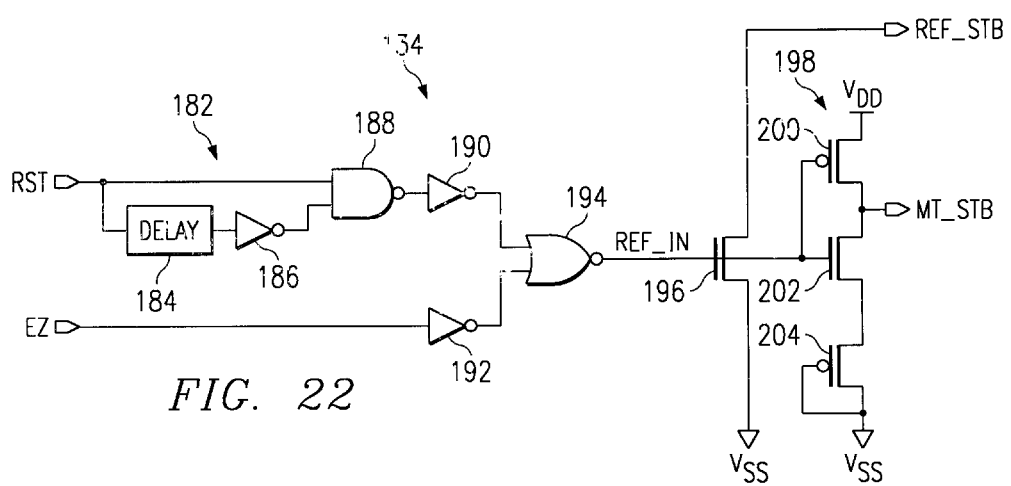
FIG. 22 is a circuit diagram that shows the constitution of the refresh control part for standby cycles in the SRAM of the embodiment.

An example circuit configuration for second refresh control part 134 for a standby cycle is shown in FIG. 22. This configuration example has refresh cycle control circuit 182, word line drive circuit 196 for refresh, and refresh monitor drive circuit 198.

Refresh cycle control circuit 182 includes delay circuit 184, inverter circuits 186, 190, and 192, NAND gate 188, and NOR gate 194. Reset signal RST from refresh monitor part 136 and status signal EZ from control part 44 are input, and internal refresh control signal REF-IN is output.

Word line drive circuit 196 for refresh contains an NMOS transistor. The source terminal of this NMOS transistor 196 is connected to low-level supply voltage $V_{SS}$, the drain terminal is connected to node (Fa) of each word line drive circuit 50(0)–(50 (n) via word line drive output line (REF-STB) for refresh, and internal refresh control signal REF-IN from refresh cycle control circuit 182 is asserted on the gate terminal.

Refresh monitor drive circuit 198 includes PMOS transistor 200, NMOS transistor 202, and PMOS transistor 204 connected in series between high-level supply voltage $V_{DD}$ and low-level supply voltage $V_{SS}$. Internal refresh control signal REF-IN from refresh cycle control circuit 182 is asserted on the gate terminals of PMOS transistor 200 and NMOS transistor 202, and refresh monitor drive signal MT-STB directed toward refresh monitor part 136 is output from the node connecting transistors 200 and 202. The drain terminal of PMOS transistor 204 is connected to supply voltage $V_{SS}$ and the gate terminal and drain terminal are interconnected. Its source terminal is connected to the source terminal of NMOS transistor 202 for driving, and it functions as a load transistor.

As stated above, status signal EZ normally maintains a low level during active cycles and a high level during standby cycles. Thus, during active cycles, the logic circuits of inverter circuit 192 and NOR gate 194 in refresh cycle control circuit 182 an active and the internal refresh control signal REF-IN that is output is normally kept at low level. Because of this, refresh cycle control circuit 182 is placed in an off state, that is, a resting state. And in refresh monitor drive circuit 198, NMOS transistor 202 is off and PMOS transistor 200 is on, thus, refresh monitor activation signal MT-STR maintains an inactive voltage level $V_{DD}$.

During standby cycles, while reset signal RST is at low level, the output of inverter circuit 190 is low level, and the output of NOR gate 194, that is, refresh control signal REF-IN will be high level. Thus, the NMOS transistor of word line drive circuit 196 for refresh will turn on, and the potential of node (Fa) of each word line drive circuit 50(0)–(50(n) by means of word line drive output line REF-STB for refresh and then the potential of each word line (WLB0)–(WLBn) by means of each PMOS transistor 148 will gradually be lowered at a prescribed rate from high-level reference voltage $V_{DD}$ toward low level. On the other hand, in refresh monitor drive circuit 198, PMOS transistor 200 is turned off, and at the same time, NMOS transistor 202 turns on, and the potential voltage of refresh monitor drive signal MT-STR will gradually be lowered at a prescribed rate from high-level reference voltage $V_{DD}$ toward low level. As discussed below, in response to the gradual voltage level drop of this refresh monitor drive signal MT-STR, refresh monitor part 136 carries out monitor operations for the refresh cycle.

When reset signal RST from refresh monitor part 136 changes from low level to high level, in refresh cycle control circuit 182, internal refresh control signal REF-IN temporarily becomes low level for a time equal to the delay time of delay circuit 184. Because of this, both word line drive circuit 196 for refresh and refresh monitor drive circuit 198 are reset. Then, when reset signal RST returns to low level, internal refresh control signal REF-IN also returns to high level and the aforementioned operation by word line drive circuit 196 for refresh and refresh monitor drive circuit 198 will be resumed.

Figure 23:
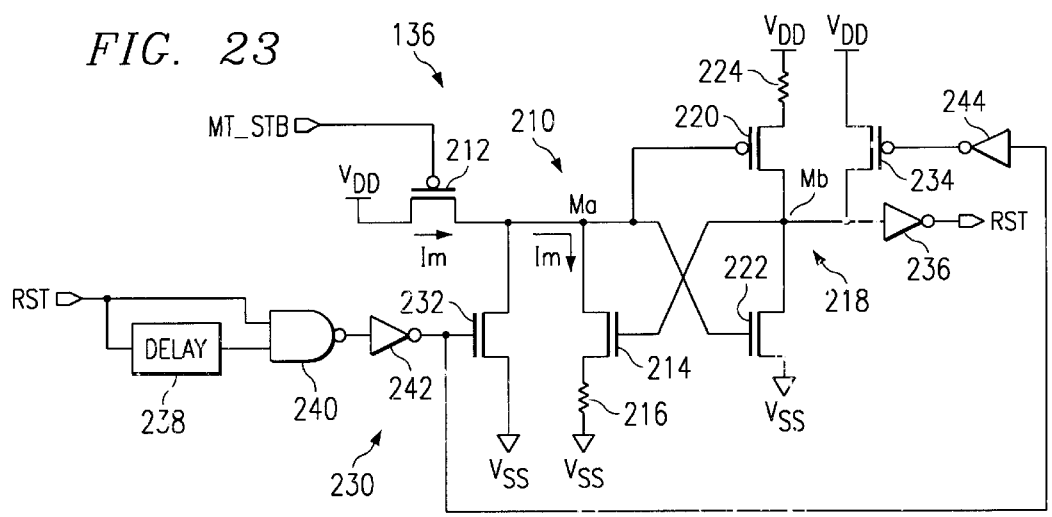
FIG. 23 is a circuit diagram that shows the constitution of the refresh monitor part in the SRAM of the embodiment.

An example circuit configuration for refresh monitor part 136 is shown in FIG. 23. Refresh monitor part 136 in this configuration example includes monitor cell 210 with a constitution resembling memory cell (MC) in memory cell array 40, and reset part 230 for resetting this monitor cell 210 to specific conditions.

The source terminal of PMOS transistor 212 in monitor cell 210 is connected to high-level reference potential terminal, for example, a $V_{DD}$ supply voltage terminal. The drain terminal is connected to monitor node (Ma), and refresh monitor activation signal MT-STR from refresh monitor drive circuit 198 of aforementioned refresh control part 134 is asserted on the gate terminal. The source terminal of NMOS transistor 214 is connected via resistor 216 to a low-level reference potential terminal, for example, a $V_{SS}$ supply voltage terminal, and the drain terminal is connected to monitor node (Ma). The input terminals of CMOS inverter 218, that is, the gate terminals of PMOS transistor 220 and NMOS transistor 222, are connected to monitor node (Ma), and the output terminal, that is, the node connected to the drain terminals (node Mb) of PMOS transistor 220 and NMOS transistor 222, is connected to the gate terminal of NMOS transistor 214. The source terminal of PMOS transistor 220 is connected to high-level supply voltage $V_{DD}$ through resistor 224, and the source terminal of NMOS transistor 222 is directly connected to low-level supply voltage $V_{SS}$.

In this way, the constitution of memory cell 210 resembles the constitution of memory cell (MC) in memory cell array 40. For reasons discussed below, PMOS transistor 21, NMOS transistor 214, and CMOS inverter 218 (PMOS transistor 220 and NMOS transistor 222) in monitor cell 210 are preferably designed with the same constitution or characteristics as the corresponding PMOS transistor 10, NMOS transistor 12, CMOS inverter 14 (PMOS transistor 16 and NMOS transistor 18) in memory cell (MC).

Reset part 230 has NMOS transistor 232 and PMOS transistor 234 for precharging monitor node (Ma) and inverter node (Mb) in monitor cell 210 during initialization to low-level reference potential $V_{SS}$ and high-level reference potential $V_{DD}$, respectively. It also includes inverter circuit 236 for generating reset signal RST from inverter node (Mb), and a reset activation circuit (delay circuit 238, NAND gate 240, and inverter circuits 242 and 244) for resetting the two transistors 232 and 234 for precharging to active (on) by monitor cell 210 for a prescribed time (delay time of delay circuit 238) in response to reset signal RST.

This refresh monitor part 136 is interlocked or synchronized with refresh control part 134 during standby cycles. When monitor cell 210 is initialized or reset by reset part 230, the potential of monitor node (Ma) is precharged to low-level reference potential $V_{SS}$ and NMOS transistor 214 turns on.

After this initialization, the voltage level of refresh monitor drive signal MT-STR from refresh control part 134 gradually decreases at a prescribed rate from high-level reference voltage $V_{DD}$ toward low level, and along with this, the leakage current or conductive current (monitor current) $I_m$ of PMOS transistor 212 will gradually increase. At the same time, NMOS transistor 214 is on, so monitor current $I_m$ fed to monitor node (Ma) from PMOS transistor 212 flows into the reference voltage $V_{SS}$ terminal through NMOS transistor 214 and resistor 216.

Thus, as time passes after initialization, monitor current $I_m$ gradually increases, and the potential of monitor node (Ma) rises at the same time from low-level reference potential $V_{SS}$ toward high level. Then, when the potential of monitor node (Ma) exceeds a prescribed set value or threshold value, the potential of node (Mb) in inverter 218 is logically inverted and changed from high level up to that point to low level. In so doing, NMOS transistor 214 will turn off, and at the same time, high-level reset signal RST will be output from inverter circuit 236. The inverted threshold value for monitor node (Ma) potential can be set and adjusted by changing the resistance values of resistors 216 and 224.

When reset signal RST becomes high level, reset part 230 in refresh monitor part 136 is activated. NMOS transistor 232 and PMOS transistor 234 are both turned on, and monitor node (Ma) and inverter node (Mb) are initialized to a low-level and a high-level reference potential, respectively.

Also, when reset signal RST becomes high level, initialization or control is performed by both aforementioned refresh control part 134 and state switching part 130 for standby cycles. With refresh control part 134, NMOS transistor 202 for driving turns off in refresh monitor drive circuit 198, and at the same time, conversely, PMOS transistor 200 for reset turns on, and refresh monitor drive signal MT-STB is returned to high-level reference voltage level $V_{DD}$. With state switching part 130, state switching signal SW becomes low level in response to high-level reset signal RST, and PMOS transistor 140 of each word line drive circuit 50(j) is turned on. Because of this, each word line (WLBj) is returned to high-level reference potential $V_{DD}$ from supply voltage $V_{DD}$ by means of PMOS transistors 140 and 148.

While monitor current $I_m$ is flowing in the aforementioned way in monitor cell 210 in refresh monitor part 136, and this monitor current $I_m$ gradually increases, the potential of each word line (WLB0)–(WLBn) gradually drops at a prescribed rate from high-level reference potential $V_{DD}$ toward low level via word line drive output line (REF-STB) for refresh and each word line drive circuit 50(0)–(50(n) because of refresh control part 134 for standby cycles. Thus for each memory cell (MC) in memory cell array 40, leakage current $I_{off\text{-}P}$ of transfer gate PMOS transistor 10 gradually increases. Thus, the drop in potential of data storage node (Na) caused by leakage current $I_{off\text{-}N}$ of NMOS transistor 12 for data latching, particularly drops in high-level potential for data where the logical value "1" is stored, is restored or refreshed.

Then, when monitor current $I_m$ in refresh monitor 136 reaches a set value and reset signal RST changes from low level to high level, for each memory cell (MC), the potential of each word line (WLB) will return to high-level reference potential $V_{DD}$, PMOS transistor 10 will be turned off, and one refresh cycle will be completed.

Next, the principal operation of the SRAM in this embodiment will be explained for FIGS. 24–26.

During standby cycles, control signal WRITE for writing and control signal READ for reading in each block (BLj) of memory cell array 40 is kept at the inactive low level. Because of this, data input circuit 80 and sense amplifier 90 are electrically blocked from global data input/output lines (GIO) and (GIO–).

At the same time, each data input select line (IOSEL) (ULIOSEL0, UWIOSEL0, ULIOSEL1, UWIOSEL1, LLIOSEL0, LWIOSEL0, LLIOSEL1, LWIOSEL1) is kept at the inactive low level, and because of this, upper local data input/output line (UBIT), upper reference potential line (USL), lower local data input/output line (LBIT), and upper [sic; lower] reference potential line (LSL) is precharged to high-level supply voltage $V_{DD}$ by means of PMOS transistors 58, 60, 66, and 70, respectively, which have been turned on.

Also due to the fact that control signals WRITE and READ are each low level, precharge circuit 125 for both global data input/output lines (GIO) and (GIO–) will be on or active and both global data input/output lines (GIO) and (GIO–) are precharged to high-level supply voltage $V_{DD}$.

Figure 24:
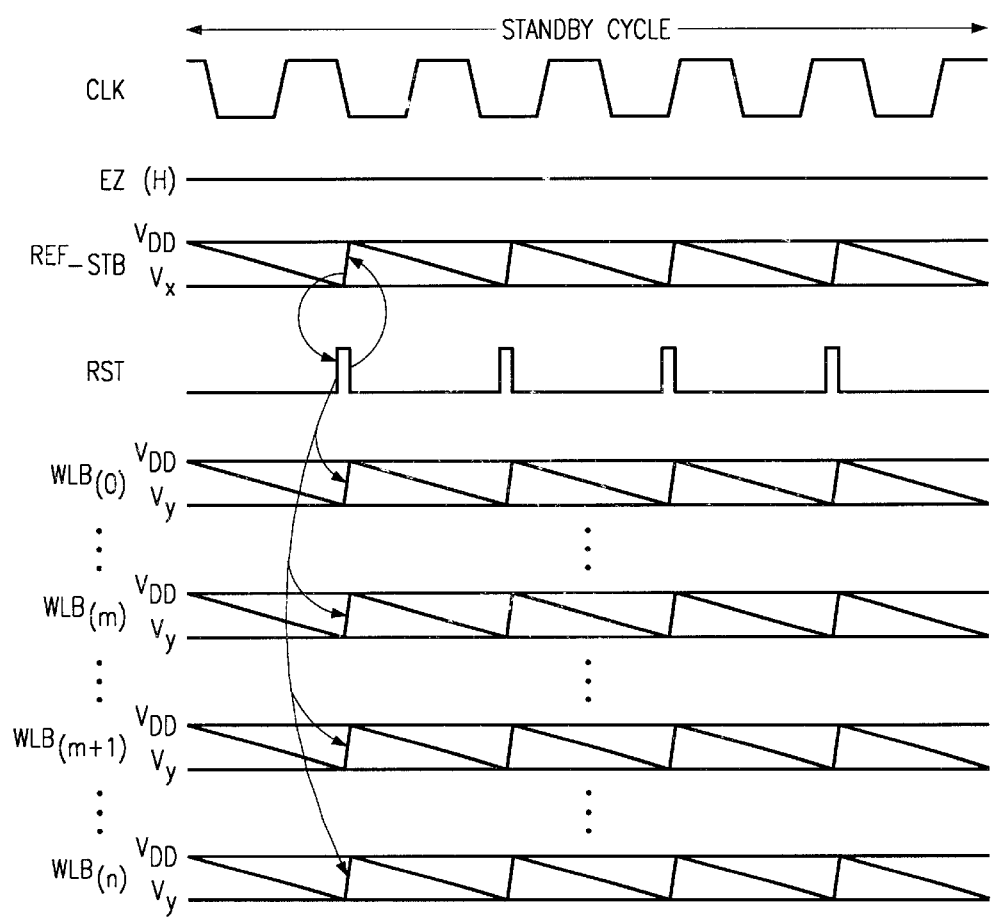
FIG. 24 shows the waveforms of signals or voltages of each major part during a standby cycle in the SRAM of the embodiment.

In control part 44, status signal EZ is kept at high level during standby cycles (FIG. 24). Because of this, state switching part 130 outputs high-level switching signal SW, and PMOS transistor 140 of each word line drive circuit 50(j) in word line driver 50 turns off. In each word line drive circuit 50(j), each word line selection signal x-dec(j) from address decoder 48 maintains an inactive low level, so NMOS transistor 150 for driving is off and switch PMOS transistor 148 will be on. Because of this, word line drive output line (REF-STB) of word line drive circuit 196 for refresh in refresh control part 134 during standby cycles is electrically connected to each word line (WLBj) via node (Fa) of each word line drive circuit 50(j) and PMOS transistor 148 which has been turned on.

Then, in refresh control part 134, because status signal EZ is kept at high level, refresh cycle control circuit 32 word line drive circuit 196 for refresh and refresh monitor drive circuit 198 are each in an enabled and operating state. As stated above, when reset signal RST become high level, each part in refresh control part 134 is reset or initialized, and when RST returns to low level, operation by each part for the refresh cycle is started.

In short, after initialization, potential provided to each word line (WLBj) by word line drive output line (REF-STB) from word line drive circuit 196 for refresh gradually drops at a fixed rate from initial level $V_{DD}$ (FIG. 24). Because of this, in each memory cell (MC) leakage current $I_{off\text{-}P}$ of transfer gate PMOS transistor 10 gradually increases and data stored in data storage node (Na) (particularly, high-level data) are refreshed. At the same time, in parallel with this refreshing of each memory cell (MC), the voltage level of refresh monitor drive signal (MT-STB) that is output from refresh monitor drive circuit 198 gradually drops at a fixed rate from initial level $V_{DD}$ (FIG. 24). Because of this, in monitor cell 210 of refresh monitor part 136, monitor current $I_m$ flowing through PMOS transistor 212 gradually increases and the potential of monitor node (Ma) gradually rises as time passes.

Then, when the potential of monitor node (Ma) exceeds a specific threshold value, reset signal RST is inverted from low level to high level by refresh monitor part 136. In response to this, the monitor operation in monitor cell 210 is completed and each part in refresh control part 134 is reset. At the same time, each word line (WLBj) in each word line drive circuit 50(j) is returned to the inactive high-level reference potential $V_{DD}$ by controlling state switching part 130.

In the aforementioned type of refresh operation during standby cycles, as shown in FIG. 24, word line voltage REF-STB and refresh monitor drive signal MT-STB that are provided to each word line (WLBj) and refresh monitor part 136, respectively, from refresh control part 134 oscillate cyclically with the same timing (synchronized) as rectangular sawtooth waveforms between high-level reference potential $V_{DD}$ and potentials Vy and Vx that are lower than that reference potential. Those oscillation periods [$V_{DD}$–VY] and [$V_{DD}$–VX] can be set and adjusted in the aforementioned way by changing the threshold value at which the potential of monitor node (Ma) in monitor cell 210 is inverted, that is, by changing the resistance values of resistors 216 and 224.

Incidentally, it is common for actual semiconductor devices to have a certain amount of variation in transistor characteristics due to processing tolerances or error. With the SRAM of this embodiment, the push-pull relationship whereby each PMOS transistor 10 and NMOS transistor 12 provide current alternately in each memory cell (MC) in memory cell array 40 is an important characteristic. In particular, with refresh during standby cycles, by lowering the potential of each word line (WLBj) at a fixed rate, leakage current $I_{off\text{-}P}$ of PMOS transistor 10 will gradually increase, but the rate of restoration of the potential of data storage node (Na) (particularly high-level potential) fluctuates due to the push-pull relationship between PMOS transistor 10 and NMOS transistor 12. When PMOS transistor 10 is relatively stronger than NMOS transistor 12, the restoration rate is rapid. Conversely, when NMOS transistor 12 is relatively stronger than PMOS transistor 10, the restoration rate is slow.

Concerning the problem with this point, with the SRAM of this embodiment, PMOS transistor 212 and NMOS transistor 214 that are connected to monitor node (Ma) in monitor cell 210 and that alternately provide current are similar to PMOS transistor 10 and NMOS transistor 12 that are connected to data storage node (Na) in each memory cell (MC) and that alternately provide current. Thus, variations in the push-pull relationship between PMOS transistor 10 and NMOS transistor 12 in each memory cell (MC) also occur between PMOS transistor 212 and NMOS transistor 214 in monitor cell 210 to the same extent.

For this reason, when PMOS transistor 10 becomes relatively stronger than NMOS transistor 12 in each memory cell (MC), PMOS transistor 212 becomes stronger than NMOS transistor 214 to the same extent in monitor cell 210. Thus, the refresh cycle will be shortened by the amount by which the potential restoration rate for data storage node (Na) is accelerated and ultimately the potential of data storage node (Na) in each memory cell (MC) is refreshed to an appropriate degree as set. In this case, the oscillation period of word line voltage REF-STB and refresh monitor drive signal MT-STB will also be smaller than their respective reference values.

And when NMOS transistor 12 becomes relatively stronger than PMOS transistor 10 in each memory cell (MC), NMOS transistor 214 also becomes stronger than PMOS transistor 212 to the same extent in memory cell 210. Thus, the refresh cycle will be lengthened by the amount that the potential restoration rate of data storage node (Na) lags. Ultimately, the potential of data storage node (Na) in each memory cell (MC) is refreshed to an appropriate degree as set. In this case, oscillation period [$V_{DD}$–Vy] and [$V_{DD}$–VX] of word line voltage REF-STB and refresh monitor drive signal MT-STB will become larger than their respective standard values.

Figure 25:
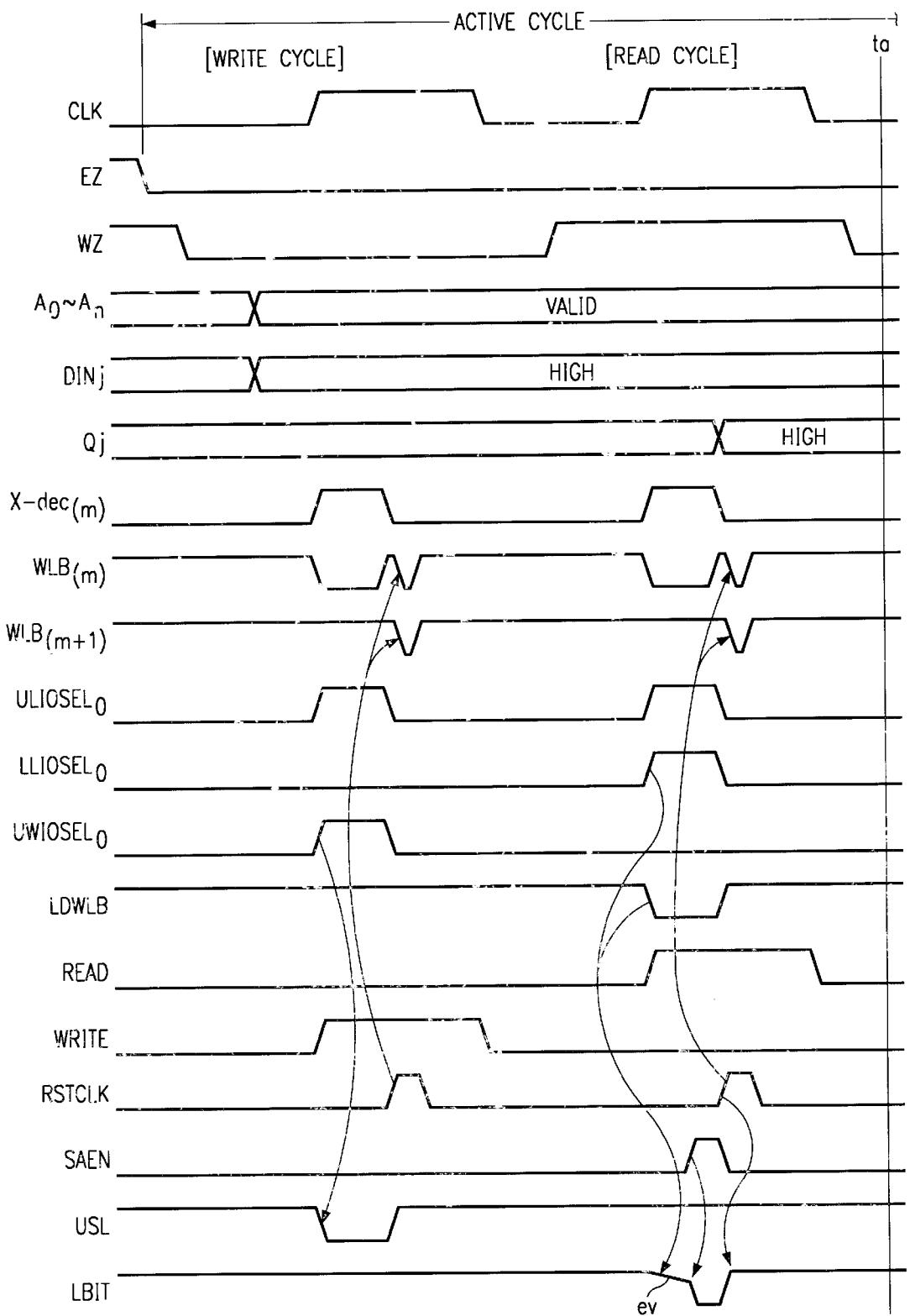
FIG. 25 shows the waveforms of signals or voltages of each major part during an active cycle in the SRAM of the embodiment.
Figure 26:
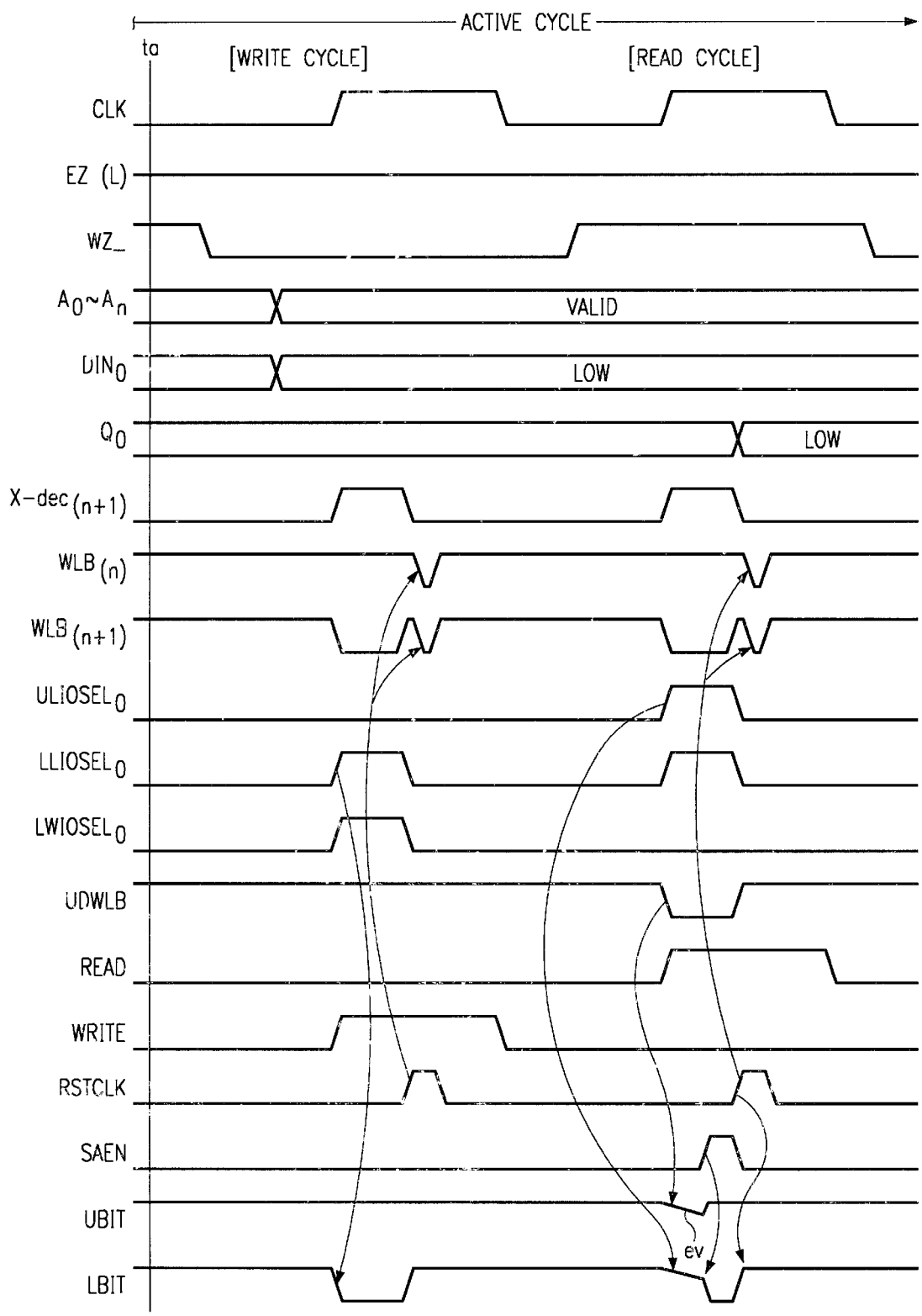
FIG. 26 shows the waveforms of the major signals or voltages during an active cycle in the SRAM of the embodiment.

The waveform or timing of signals or potential of each part in an active cycle is shown in FIGS. 25 and 26.

FIG. 25 shows an example of a "write cycle" where the value for bit data DINj with the logical value "1" is written in SRAM cell (MCm) positioned at the very end in the column at the left side of the upper region in block (BLj) (FIG. 17) in memory cell 40, and a "read cycle" that reads the stored data ("1") from said SRAM cell (MCm) immediately afterward.

When an active cycle is entered, status signal EZ becomes low level (FIG. 25). Because of this, with standby cycle refresh control part 134 (FIG. 22), internal refresh control signal REF-IN that is output from refresh cycle control circuit 182 is held at low level, and word line drive circuit 196 for refresh and refresh monitor drive circuit 198 will be turned off or disabled. And with the state switching part (FIG. 20), the output of NOR gate 152 will be low level, and the logic level of output state switching signal SW will depend on refresh enable signal REF-EN from active cycle refresh control part 132.

With the write cycle, write/read mode flag or status signal WZ becomes low level (FIG. 25). Then, simultaneous with the fetching of addresses $A_O$–$A_N$ from address buffer 42, input data $D_{IN}$ (DIN0–DINn) are fetched from data buffer 46. With this example, the value of bit data DINj corresponding to block (BLj) is the logical value "1" (high level) (FIG. 25).

Next, when clock CLK rises to high level, address decoder 48 decodes input addresses $A_O$–$A_N$, and word line selection signal x-dec(m) for selecting mth line word line (WLBm) designated by that address is alternately made an active high level. Because of this, in word line driver 50, only word line drive circuit 50(m) that receives this unique high-level word line selection signal x-dec(m) will enter word line drive mode, NMOS transistor 148 for driving turns on, and the corresponding word line (WLBm) is driven to active low level. All of the other word line drive circuits 50(0)–50(m−1), 50(m+1)–50(n) are kept in standby mode and their respective corresponding word lines (WLB0)–(WLBm−1), (WLBm+1)–(WLBn) are kept at an inactive high level.

At the same time, control signal WRITE for writing becomes high level. Because of this, in data input circuit 80 of each block (BL0)–(BLn), transistor gate NMOS transistors 86 and 88 turn on and input bit data DINj and inverted bit data DINJ— are supplied to global data input/output lines (GIO) and (GIO−), respectively. With this example, DINj (GIO) is high level and DINj–(GIO−) is low level in block BLj.

And in the data input/output select lines (ULIOSEL0, UWIOSEL0, ULIOSEL1, UWIOSEL1) and (LLIOSEL0, LWIOSEL0, LLIOSEL1, LWIOSEL1), only (ULIOSEL0) and (UWIOSEL0) selectively go to an active high level, and all the other are kept at an inactive low level.

When (ULIOSEL0) and (UWIOSEL0) become high level, for each block (BL0)–(BLn), transfer gate NMOS transistor 56(0) and switching NMOS transistor 60(0) are selectively turned on and upper local data input/output line (UBIT) and upper reference potential line (USL) for SRAM cells (MC0)–(MCm) in the left column of the upper region are electrically connected to global data input/output lines (GIO) and (GIO−) by their transistors 56(0) and 60(0).

Thus, when word line (WLBm) is driven to an active low level in the aforementioned way, transfer gate PMOS transistor 10 of said SRAM cell (MCm) in each block (BL0)–(BLn) turns on and high-level input bit data DINj are written to said data storage node (Na) over global data input/output line (GIO), upper local data input/output line (UBIT), and bit line (BLm). In this case, the low-level potential of inverted bit data DINj— is provided as source voltage Vc in FIG. 7 to the source terminal of PMOS transistor 16 that constitutes CMOS inverter 14 in the appropriate SRAM cell (MCm) via global data input/output line (GIO−) and upper reference potential line (USL). That is, the technique in FIG. 8 is used and high level (data at the logical value "1") is written at high speed to said SRAM cell (MCm).

When data write is completed in the aforementioned way, word line selection signal x-dec(m) and data input/output select lines (ULIOSEL0) and (UWIOSEL0) are returned to an inactive low level. Because of this, NMOS transistors 56(0) and 60(0) that had been turned on up to that point are turned off in each block (BL0–BLn). Simultaneously, in contrast, PMOS transistors 58(0) and 62(0) are turned on, and said upper local data input/output line (UBIT) and upper reference potential line (USL) are again precharged to high-level supply voltage $V_{DD}$.

Immediately afterward, in refresh control part 132 (FIG. 21), refresh enable signal REF-EN provided from the timing circuit in control part 44 is changed from the inactive low level up to that point to an active high level. In this way, output refresh enable signal REF-EN and refresh control signal REFA both become an active high level. Here, REFA maintains a high level only for a time period equal to the delay time of delay circuit 160, and REF-EN maintains a high level only for a time period equal to the sum of the delay times of delay circuits 160 and 162.

Because of this, PMOS transistor 140 turns on in each word line drive circuit 500–50(n) of word line driver 50. Simultaneously, NMOS transistor 142 turns on, and each word line (WLB0–WLBn) is driven toward low level by a specific constant current by NMOS transistors 142 and 144 through PMOS transistor 148 which has been turned on, and node (Fa). Each word line (WLB0–WLBn) is activated simultaneously, transfer gate PMOS transistor 10 in all the memory cells (MC) in memory cell 40 is turned on, and current is supplied to each data storage node (Na) by a corresponding upper local data input/output line (UBIT) or lower local data input/output line (LBIT) that has been precharged by supply voltage $V_{DD}$ or by a corresponding PMOS transistor 10 which has been turned on from each bit line (BL). Current to each of these data storage nodes (Na) flows only during the time that refresh control signal REFA in refresh control part (132) maintains a high level.

Thus, in each memory cell (MC) where high-level data are stored, the amount of voltage drop produced by the leakage current of NMOS transistor 12 for data latching is compensated by supplying current to each data storage node (Na) from each bit line (BL). That is, storage is refreshed. At the same time, in each memory cell (MC) where low-level data are stored, NMOS transistor 12 for latching is on, so current supplied to each data storage node (Na) from each bit line (BL) is rapidly absorbed into the low-level supply voltage $V_{SS}$ through NMOS transistor 12 which has been turned on. For this reason, the stored data (low level) are not affected.

In FIG. 25, when a read cycle is entered, read/write mode flag WZ becomes high level. With this example, addresses $A_O–A_N$ input during the immediately preceding write cycle are maintained in address buffer 42.

Also, while not shown in FIG. 25, when the write cycle is started, in sense amplifier 90, precharging control signal EQ becomes low level and each PMOS transistor 102, 104, and 106 for precharging turns on. Because of this, data input/output lines (MO) and (MO–) in sense amplifier 90 are precharged to high-level supply voltage $V_{DD}$. At this stage, transfer gates 92 and 94 are still off, and data input/output lines (MO) and (MO–) in sense amplifier 90 are electrically isolated from global data input/output lines (GIO) and (GIO–). Global data/input output lines (GIO) and (GIO–) are precharged to high-level supply voltage $V_{DD}$ by precharge circuit 125. And local data input/output lines (UBIT) and (LBIT) and reference potential lines (USL) and (LSL) are precharged to high-level supply voltage $V_{DD}$ individually via their respective PMOS transistors 58, 66, 62, and 70, that are on.

Next, when clock CLK rises to high level, just like in the immediately preceding write cycle, address decoder 48 makes word line selection signal x-dec(m) a unique active high level. Because of this, word line (WLBm) selected by word line drive circuit 50(m) in word line driver 50 is driven to a unique active low level. When the word lines (WLBm) positioned in the upper region are selected in this read cycle, dummy cell selection line (LDWLB) for dummy cell (LDC) in the lower region is driven to an active low level by the dummy cell drive circuit in word line driver 50.

At the same time, control signal READ for reading becomes high level. Because of this, transfer gate NMOS transistors 92 and 94 come on in sense amplifier 90 of each block (BL0)–(BLn). Simultaneous with this, control signal EQ for precharging becomes high level, all of precharge transistors 102, 104, and 106 turn on, and data input/output lines (MO) and (M0–) in sense amplifier 90 are electrically connected to global data input/output lines (GIO) and (GIO), respectively, through transfer gates 92 and 94 at the same impedance state and at high-level reference potential $V_{DD}$. In this case, global data input/output lines (GIO) and (GIO) are also at high impedance and at high-level reference potential $V_{DD}$, due to the fact that control signal READ has become high level and precharge circuit 125 is turned off.

And in the data input select lines (ULIOSEL0, UWIOSEL0, ULIOSEL1, UWIOSEL1) and (LLIOSEL0, LWIOSEL0, LLIOSEL1, LWIOSEL1), only (ULIOSEL0) and (LLIOSEL0) selectively become an active high level, and all the other are kept at an inactive low level.

When (ULIOSEL0) becomes high level, PMOS transistor 58 for precharging turns on, and at the same time, transfer gate NMOS transistor 56(0) turns on. Because of this, bit line (BLm) or upper local data input/output line (UBIT) and first global data in/put/output line (GIO) and first data input/output line (MO) in sense amplifier 90 are electrically connected to each other in an unchanged high-impedance state at their respective high-level reference potential $V_{DD}$.

At the same time, when (LLIOSEL0) becomes high level, PMOS transistor 66(0) for precharging turns off, and at the same time, transfer gate NMOS transistor 64(0) turns on. Because of this, lower local data input/output line (LBIT) and second global data input/output line (GIO–) and second data input/output line (MO–) in sense amplifier 90 are electrically connected to each other in an unchanged high-impedance state at their respective high-level reference potential $V_{DD}$.

Thus, when word line (WLBm) is driven to an active low level in the aforementioned way, transfer gate PMOS transistor 10 of said SRAM cell (MCm) turns on in each block (BL0)–(BLn) and the potential stored in data storage node (Na) is read out to bit line (BLm) or upper local data input/output line (UBIT) by this PMOS transistor 10. With this example, high level is read from said SRAM cell (MCm), so the potential of bit line (BLm) remains near the high-level precharge potential or reference potential $V_{DD}$. The read voltage signal on this bit line (BLm) is asserted on first node (E) of amplifier circuit 98 over upper local data input/output line (UBIT), first global data input/output line (GIO) and first data input/output line (MO) in sense amplifier 90.

At the same time, when lower dummy cell selection line (LDWLB) is driven to an active low level in the aforementioned way, PMOS transistor 72 for the output of lower dummy cell (LDC) is turned on. In this way, discharge current flows to low-level supply voltage $V_{SS}$ from lower local data input/output line (LBIT) that has been precharged to high-level reference potential $V_{DD}$ through PMOS transistor 72 and NMOS transistor 74 that have been turned on. Because of this, voltage that drops at a fixed rate from high-level precharge potential $V_{DD}$, that is, comparison reference voltage ev, is produced at the drain terminal of PMOS transistor 72. The rate at which this comparison reference voltage ev drops can be set and adjusted by the turn-on resistance of both transistors 72 and 74.

Comparison reference voltage ev output from lower dummy cell (LDC) in the aforementioned way is asserted on second node (E–) of amplifier circuit 98 via lower local data input/output line (LBIT), second global data input/output line (GIO–), and second data input/output line (MO–) in sense amplifier 90.

With this example, a high level is read from said SRAM cell (MCm) in the aforementioned way, so input voltage (read voltage signal) at first node (E) is near high-level reference potential $V_{DD}$ and will be higher than input voltage (comparison reference voltage) at second node (E–). When sense amplifier enable signal SAEN is changed to a high level at a specific timing, amplifier circuit 98 of sense amplifier 90 is activated, and by differentially amplifying the difference in potential between the two nodes (E) and (E–), the potential of first node (E) or first data input/output line (MO) is raised to high-level reference potential $V_{DD}$. Simultaneously, the potential of second node (E−) or second data input/output circuit (MO−) is lowered to low-level reference potential $V_{SS}$. The result is that the value of high-level (logical value "1") bit data Qi is output from data output circuit 100.

While detection and amplification for reading data is performed in sense amplifier 90 in the aforementioned way, word line selection signal x-dec(m) and data input/output selection line (ULIOSEL0) and (LLIOSEL0) are returned to an inactive low level. Because of this, the appropriate upper local data input/output line (UBIT) and the lower local data input/output line (LBIT) in each block (BL0)–(BLn) are electrically isolated from global data input/output lines (GIO) and (GIO−), respectively, and are again precharged to high-level supply voltage $V_{DD}$.

Immediately afterward, in refresh control part 132 (FIG. 21), both output refresh enable signal REF-EN and refresh control signal REFA become high level for only a fixed time period at the same timing as the aforementioned write cycle. Because of this, transfer gate PMOS transistor 10 in each memory cell (MC) in memory cell array 40 is turned on according to the same operation as the aforementioned write cycle. The potential of each data storage node (Na) is refreshed by high-level precharge voltage $V_{DD}$ of each bit line (BL) if the stored data are high level. If the stored data are low level, they remain at the same potential without being affected.

With the example in FIG. 26, a "write cycle" where bit data DINJ for the logical value "0" are written to SRAM cell (MCm+1) positioned at the head of the left column in the upper region in block (BLj) (FIG. 17) that is in memory cell array 40, and a "read cycle" where the stored data ("0") are read from said SRAM cell (MCm+1) immediately afterward are shown. What is different from the example in FIG. 25 is the position of the SRAM cell (MC) where data are written/read (a difference between upper region and lower region), and the logical value of the data (a difference between high level and low level). Items related to these differences will be generally discussed below.

With the write cycle, in each block (BL), data input/output select lines (LLIOSEL0) and (LWIOSEL0) are selectively activated to an active high level and the lower local data input/output line (UBIT) and lower reference potential line (USL) in the corresponding column are used for writing data (low level) to the appropriate SRAM cell (MCm+1). Word line (WLBm+1) corresponding to said SRAM cell (MCm+1) is also selectively activated. Logical voltage (high level) the inverse of input bit data DINJ ("0") from data input circuit 80 is provided to bit line (BLm+1) corresponding to said SRAM cell (MCm+1) via second global input/output line (GIO−) and lower local data input/output line (UBIT). Thus, high level is written as data "0" with negative logic in said SRAM cell (MCm+1). Note that in this case, the low-level potential of input bit data DINj— is provided as supply voltage Vc in FIG. 7 to the source terminal of PMOS transistor 16 that constitutes CMOS inverter 14 in said SRAM cell (MCm+1) via global data input/output line (GIO) and lower part reference potential line (LSL).

Then, when the write operation is completed, a refresh operation by refresh control part 132 is performed immediately afterward for all SRAM cells (MC) in memory cell array 40 in the same way as described above.

With the read cycle, data input/output select lines (ULIOSEL0) and (LLIOSEL0) are selectively activated to an active high level, and lower local data input/output line (UBIT) in the corresponding column is electrically connected to second global data input/output line (GIO−). At the same time, upper reference potential line (USL) in the corresponding column is electrically connected to first global data input/output line (GIO). Simultaneously with the activation of word line (WLBm+1), upper dummy cell selection line (UDWLB) is selected. Thus, high level from said SRAM cell (MCm+1) is read to lower local data input/output line (UBIT) or second global data input/output line (GIO−) via the corresponding bit line (BLm+1), and simultaneously, comparison reference voltage ev from upper dummy cell (UDC) is read to upper reference potential line (USL) or first global data input/output line (GIO).

In sense amplifier 90, comparison reference voltage ev from first global data input/output line (GIO) is input to first node (E) of amplifier circuit 98. At the same time, a read voltage signal that remains near high level from second global data input/output line (GIO−) is input to second node (E−). In this way, low-level ("0") bit data Qj are obtained with positive logic at the output terminal of data output circuit 100.

Then, when the read operation is completed, a refresh operation is performed by refresh control part 132 immediately afterward for all the SRAM cells (MC) in memory cell array 40 in the same way as described above.

As stated above, with this SRAM, each time one write cycle or read cycle is performed in an active cycle, then (immediately afterward) an operation where all the word lines (WLB0)–(WLBn) are activated at a one time and where stored data (strictly speaking, high level) in all the SRAM cells are refreshed (hidden refresh) by the precharge potential on bit lines (BL) by control by refresh control part 132.

In standby cycles, with the aforementioned embodiment, potential $V_{WL}$ of each word line (WLBJ) will be varied cyclically with sawtooth waveforms between high-level reference potential $V_{DD}$ and unstable (fluctuating) potential Vx that is lower than that by refresh control part 134 and refresh monitor part 136.

Figure 28:
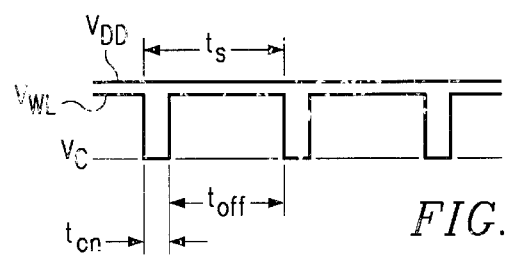
FIG. 28 shows the waveforms of the major voltages produced by the refresh method (FIG. 27) in the embodiment.

In another method, as shown in FIG. 28, refresh is also possible where word line potential $V_{WL}$ is lowered in pulses between high-level reference potential $V_{DD}$ (strictly speaking, a voltage level near that) and fixed potential Vc. With this method, one cycle is composed of on (drive) time ton and off (rest) time off, so that the amplitude ($V_{DD}-V_C$) of word line potential $V_{WL}$ during on time ton is selected to be significantly larger than the amplitude ($V_{DD}-VX$) in the aforementioned sawtooth waveform method. And from the standpoint of power consumption and stability of nonrefreshed data (low level, in this example), on time ton should be selected at the minimum limit required.

Figure 27:
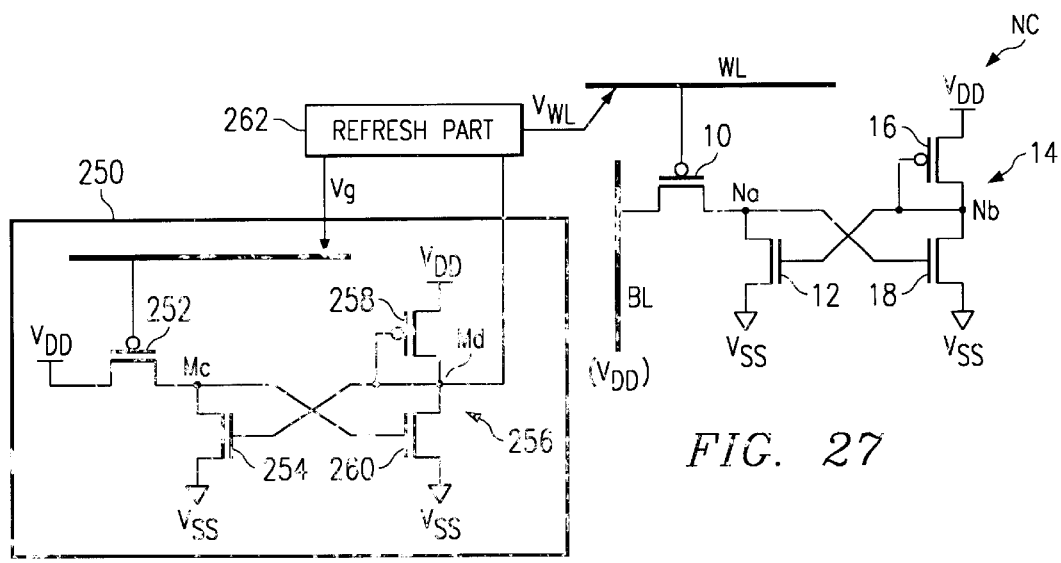
FIG. 27 is a figure for explaining another method for the refresh function for standby cycles in the embodiment.

As shown in FIG. 27, in this refresh method, monitor cell 250, which is similar to SRAM cell (MC), could be used to make aforementioned on time ton the time that is the minimum required due to processing variation of each semiconductor chip. Each element-PMOS transistor 252, NMOS transistor 254, and CMOS inverter 256 (PMOS transistor 258 and NMOS transistor 260—of this monitor cell 250 corresponds to each element—PMOS transistor 10, NMOS transistor 12, and CMOS inverter 14 (PMOS transistor 16 and NMOS transistor 18), respectively—of the SRAM cell. Monitor node (Mc) and inverter node (Md) in monitor cell 250 also correspond to data storage node (Na) and inverter node (Nb), respectively, in SRAM cell (MC).

Refresh part 262 raises the potential $V_{WL}$ of each word line (WLBj) via word line driver to Vc at fixed cycle Ts.

Simultaneously, gate potential Vg of PMOS transistor 252 in monitor cell 250 is lowered to a prescribed level (amplitude). In this case, monitor node (Mc) and inverter node (Md) in monitor cell 250 are initialized or precharged to low-level reference potential $V_{SS}$ and high-level reference potential $V_{DD}$, respectively, by a reset circuit (not shown).

Thus, with each SRAM cell (MC), transfer gate PMOS transistor 10 conducts or turns on, and high-level stored data in data storage node (Na) is refreshed by the high-level reference potential $V_{DD}$ of bit line (BL). During this period, with monitor cell 250, PMOS transistor 252 conducts or turns on and the potential of monitor node (Mc) rises due to charge current from high-level supply voltage $V_{DD}$. Then, when the potential of monitor node (Mc) exceeds the threshold value of specific inverter 256 and goes to the high level, the potential of inverter node (Md) changes to the low level; in response, refresh control part 262 returns word line potential $V_{WL}$ to an inactive high-level reference potential ($V_{DD}$).

Figure 29:
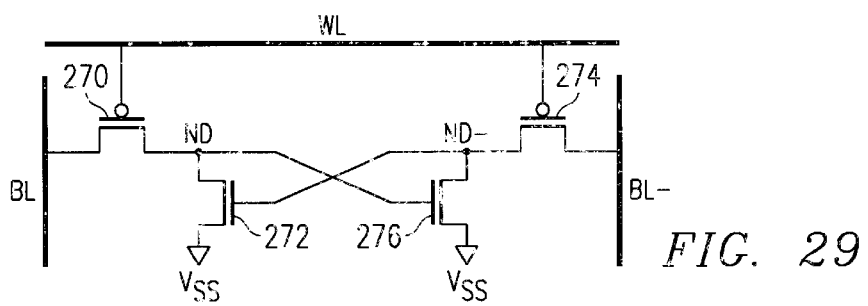
FIG. 29 is a circuit diagram that shows the constitution of another four-channel SRAM cell constitution to which the refresh method in the embodiment can be applied.
Figure 30:
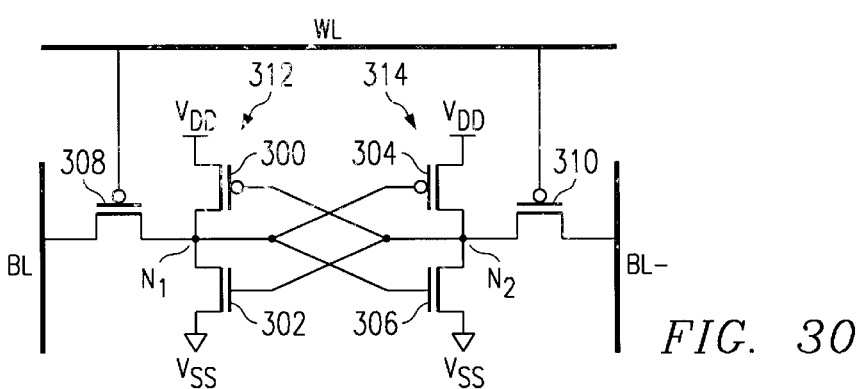
FIG. 30 is a circuit diagram that shows the constitution of an existing six-channel SRAM cell.

Note that the refresh method in the aforementioned embodiment can also be applied to a four-transistor SRAM cell as shown in FIG. 29. This SRAM cell is constituted from a pair of complementary data storage nodes (ND) and (ND−), a pair of PMOS transistors 270 and 274 for transfer gate use, and a pair of NMOS transistors 272 and 276 for data latching. It uses bit line pair (BL) and (BL−).

In this SRAM cell, when high level is written to data storage node (ND), bit line pair (BL) and (BL−) is driven to high-level and low-level reference potential, respectively, word line (WL) is activated to low level, and both PMOS transistors 270 and 274 are simultaneously turned on. When the low level is written to data storage node (ND), the logic level of the voltage of bit line pair (BL) and (BL−) is made the inverse of the aforementioned. When data are read, bit line pair (BL) and (BL−) is precharged to the same potential, for example, high-level reference potential, word line (WL) is activated to low level, and both PMOS transistors 270 and 274 are turned on simultaneously. The potentials of bit line pair (BL) and (BL−) are compared (differential amplification) and a high level or low level is determined.

During standby cycles, one of data storage nodes (ND) and (ND−) is kept on and the other node off. For example, when high level is stored in data storage node (ND), NMOS transistor 276 is kept on and NMOS transistor 272 off.

However, there is the problem that the floating potential of data storage node (ND) may drop due to the leakage current of NMOS transistor 272. Thus, by performing the same refresh operation as in the aforementioned embodiment during standby cycles or active cycles, the potential of data storage nodes (ND) and (ND−) can be reliably maintained.

As explained above, with the present invention, it is possible to realize significant reduction of layout area while guaranteeing data retention stability or while guaranteeing reliable and high-speed writing or reading of data.

What is claimed is:

1. Semiconductor memory cell that comprises a data storage node for electrically storing 1 bit of data in the form of a logic level, in the form of a voltage,
 a first transistor connected between a bit line and a storage node and the control terminal which is connected to a word line,
 a second transistor connected between the data storage node and a first reference voltage terminal that provides a first reference potential having a prescribed logic level, and an inverter circuit, having an input terminal connected to the data storage node, and an output terminal connected to the control terminal of the second transistor, which outputs a voltage to the output terminal at a logic level opposite that of the voltage input to the input terminal.

2. Semiconductor memory device that comprises the semiconductor memory cell described in claim 1, further comprising
 a data write means for writing the desired data to the data storage node of the semiconductor memory cell, which drives the bit line to a potential at a logic level that corresponds to the value of the data and also drives the word line to a prescribed potential to turn on the first transistor,
 and a data read means for reading data stored in the data storage node of the semiconductor memory cell, which drives the word line to a prescribed voltage to turn on the first transistor after the bit line is precharged to a potential at a logic level opposite that of the first reference potential, and that thereby outputs the stored data on the basis of the temporal change of the potential of the bit line.

3. Semiconductor memory device described in claim 2 further comprising a data hold current control means that supplies current for holding data stored in the data storage node via the first transistor and controls current for the data holding at the potential of the word line, during standby mode when writing or reading data to or from the semiconductor memory cell does not continue for more than a prescribed period of time.

4. Semiconductor memory device described in claim 2 further comprising a reference voltage control means for making the potential at the first reference voltage terminal higher or lower by a prescribed value amount relative to the first reference potential in order to reduce the current flow through the second transistor when the data write means writes data a logic level opposite that of the first reference potential to the data storage node.

5. Semiconductor memory device described in claim 4 further comprising a data hold current control means that supplies current for holding data stored in the data storage node via the first transistor and controls current for the data holding at the potential of the word line, during standby mode when writing or reading data to or from the semiconductor memory cell does not continue for more than a prescribed period of time.

6. Semiconductor memory device described in claim 2 further comprising an inversion acceleration means for speeding up the inversion of the output logic level of the inverter circuit in order to decrease the switching time of the second transistor from the on state to the off state when the data write means writes data at a logic level opposite that of the first reference potential to the data storage node.

7. Semiconductor memory device described in claim 6 further comprising a data hold current control means that supplies current for holding data stored in the data storage node via the first transistor and controls current for the data holding at the potential of the word line, during standby mode when writing or reading data to or from the semiconductor memory cell does not continue for more than a prescribed period of time.

8. Semiconductor memory device described in claim 2 further comprising a reference voltage control means that makes the potential at the first reference voltage terminal higher or lower than a prescribed amount relative to the reference potential to reduce current flow through the second transistor when the data read means reads data stored in the data storage node of the semiconductor memory cell.

9. Semiconductor memory device described in claim 1 further comprising a data hold current control means that supplies current for holding data stored in the data storage node via the first transistor and controls current for the data holding at the potential of the word line, during standby mode when writing or reading data to or from the semiconductor memory cell does not continue for more than a prescribed period of time.

10. Semiconductor memory device described in claim 9, wherein the data hold current control means comprises a monitoring node, a third transistor connected between the monitoring node and a second supply voltage terminal that provides a second reference potential at a logic level opposite that of the first reference potential, a fourth transistor connected between the monitoring node and a third supply voltage terminal that provides a third reference potential at a logic level identical to that of the first reference potential, an inverter circuit, having an input terminal of which is connected to the monitoring node, and an output terminal of which is connected to the control terminal of the fourth transistor, and that outputs voltage to the output terminal at a logic level opposite that of the voltage input to the input terminal, an initialization means that initializes the monitoring node to a logic level for keeping the fourth transistor turned on, a monitor control means that controls the potential of the control terminal of the third transistor so that the current that flows through the third transistor gradually increases with time after the initialization, a word line potential control means that controls the potential of the word line so that the current flow through the first transistor will gradually increase with time after the initialization, and a reset means that stops the control operation of the word line potential control means and returns the potential of the word line to a specific reference level when the potential of the monitoring node has reached a logic level opposite that of the logic level at the time of the initialization.

11. Semiconductor memory device described in claim 10 further comprising a resistor connected in series with the fourth transistor between the monitoring node and the third supply voltage terminal.

12. Semiconductor memory device described in claim 11 wherein the third and fourth transistors have essentially the same transistor structure as the first and second transistors, respectively, and wherein they are produced by the same process on the same semiconductor chip.

13. Semiconductor memory device described in claim 10 wherein the third and fourth transistors have essentially the same transistor structure as the first and second transistors, respectively, and wherein they are produced by the same process on the same semiconductor chip.

14. Semiconductor memory device described in claim 9, wherein the data hold current control means has a word line potential switching means that repeatedly switches at a fixed cycle between a first time when the word line is brought to an active first potential and a second time when it is brought to an inactive second potential.

15. Semiconductor memory device described in claim 14 wherein the data hold current control means comprises a monitoring node, a third transistor connected between the monitoring node and a second supply voltage terminal that provides a second reference potential at a logic level opposite that of the first reference potential, a fourth transistor connected between the monitoring node and a third supply voltage terminal that provides a third reference potential at a logic level identical to that of the first reference potential, an inverter circuit, having an input terminal of which is connected to the monitoring node and an output terminal of which is connected to the control terminal of the fourth transistor, and that outputs voltage to the output terminal at a logic level opposite that of the voltage input to the input terminal, an initialization means that precharges the monitoring node to a potential at a logic level for keeping the fourth transistor turned on, and a monitor control means that drives the control terminal of the third transistor to a prescribed potential after the first time starts to service current between the third supply voltage terminal and the monitoring node via the third transistor, and when the potential of the monitoring node reaches a logic level opposite that of the logic level at the time of the initialization, provides a signal for switching from the first time to the second time to the word line potential switching means.

16. Semiconductor memory device described in claim 9 further comprising a refresh control means that, during a write cycle where the desired data are written to the semiconductor memory cell selected in a memory cell array, drives all the bit lines of the memory cell array to a potential at a prescribed logic level for a prescribed time independently of the time during which the word line is enabled for writing data to the selected semiconductor memory cell, and that also drives all of the word lines to a prescribed potential and makes the first transistor in all of the semiconductor memory cells conduct.

17. Semiconductor memory device described in claim 9 further comprising a refresh control means that, during a read cycle for reading stored data from the semiconductor memory cell selected in a memory cell array, drives all the bit lines in the memory cell array to a potential at a prescribed logic level for a prescribed time independently of the time during which the word line is enabled to read data for the selected semiconductor memory cell, and that also drives all of the word lines to a prescribed potential and makes the first transistors in all of the semiconductor memory cells conduct.

* * * * *